(12) United States Patent
Kumagai et al.

(10) Patent No.: US 10,469,783 B2
(45) Date of Patent: Nov. 5, 2019

(54) SOLID-STATE IMAGE SENSOR AND IMAGING APPARATUS

(71) Applicant: SONY CORPORATION, Tokyo (JP)

(72) Inventors: Yoshimichi Kumagai, Kanagawa (JP); Takashi Abe, Kanagawa (JP); Kazuyoshi Yamashita, Kanagawa (JP); Ryoto Yoshita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/067,316

(22) PCT Filed: Nov. 30, 2016

(86) PCT No.: PCT/JP2016/085578
§ 371 (c)(1),
(2) Date: Jun. 29, 2018

(87) PCT Pub. No.: WO2017/126232
PCT Pub. Date: Jul. 27, 2017

(65) Prior Publication Data
US 2019/0014278 A1 Jan. 10, 2019

(30) Foreign Application Priority Data

Jan. 21, 2016 (JP) ................................. 2016-009365

(51) Int. Cl.
*H04N 5/3745* (2011.01)
*H01L 27/146* (2006.01)
(Continued)

(52) U.S. Cl.
CPC ....... *H04N 5/37452* (2013.01); *H01L 27/146* (2013.01); *H01L 27/1461* (2013.01);
(Continued)

(58) Field of Classification Search
CPC .... H04N 5/357; H04N 5/361; H04N 5/37452; H04N 5/37457; H01L 27/14603; H01L 27/1461; H01L 27/14612
See application file for complete search history.

(56) References Cited

U.S. PATENT DOCUMENTS

2008/0074524 A1* 3/2008 Panicacci .......... H01L 27/14609
348/308
2010/0128157 A1 5/2010 Panicacci
(Continued)

FOREIGN PATENT DOCUMENTS

CN 104349077 A 2/2015
CN 104469200 A 3/2015
(Continued)

OTHER PUBLICATIONS

International Search Report and Written Opinion of PCT Application No. PCT/JP2016/085578, dated Feb. 7, 2017, 9 pages of ISRWO.

*Primary Examiner* — Daniel M Pasiewicz
(74) *Attorney, Agent, or Firm* — Chip Law Group

(57) ABSTRACT

To transfer all charges retained in a charge retention region. The photoelectric converter generates a charge corresponding to the exposure amount during a predetermined exposure period. The generated-charge retention portion and the output charge retention portion retain the charge. The generated-charge transfer portion transfers the charge from the photoelectric converter to the generated-charge retention portion to perform the generated-charge transfer after the elapse of the exposure period. The retained-charge transfer portion transfers the charge retained in the generated-charge retention portion to the output charge retention portion to perform the retained-charge transfer. The generated-charge retention gate portion applies a control voltage that is a voltage for controlling potential of the generated-charge (Continued)

retention portion to the generated-charge retention portion during a period of the generated-charge transfer and the retained-charge transfer, applies a bias voltage that is a voltage having a polarity different from the control voltage to the generated-charge retention portion during a period different from the period of the generated-charge transfer and the retained-charge transfer, and applies the bias voltage to the generated-charge retention portion after applying an approximately intermediate voltage between the control voltage and the bias voltage to the generated-charge retention portion at the end of the period of the retained-charge transfer.

11 Claims, 22 Drawing Sheets

(51) Int. Cl.
*H04N 5/361* (2011.01)
*H04N 5/357* (2011.01)

(52) U.S. Cl.
CPC .. *H01L 27/14603* (2013.01); *H01L 27/14612* (2013.01); *H04N 5/357* (2013.01); *H04N 5/361* (2013.01); *H04N 5/37457* (2013.01)

(56) References Cited

U.S. PATENT DOCUMENTS

| | | | |
|---|---|---|---|
| 2011/0241079 A1* | 10/2011 | Oike | H01L 27/14616 257/225 |
| 2012/0153125 A1* | 6/2012 | Oike | H01L 27/14612 250/208.1 |
| 2015/0028189 A1 | 1/2015 | Hagiwara et al. | |
| 2015/0085170 A1 | 3/2015 | Takeda | |
| 2016/0080676 A1 | 3/2016 | Takeda | |

FOREIGN PATENT DOCUMENTS

| | | |
|---|---|---|
| JP | 2015-23250 A | 2/2015 |
| JP | 2015-023250 A | 2/2015 |
| JP | 2015-65271 A | 4/2015 |
| JP | 2015-065271 A | 4/2015 |
| TW | 200820760 A | 5/2008 |
| WO | 2008/027193 A2 | 3/2008 |

* cited by examiner

SOLID-STATE IMAGE SENSOR AND IMAGING APPARATUS

CROSS REFERENCE TO RELATED APPLICATIONS

This application is a U.S. National Phase of International Patent Application No. PCT/JP2016/085578 filed on Nov. 30, 2016, which claims priority benefit of Japanese Patent Application No. JP 2016-009365 filed in the Japan Patent Office on Jan. 21, 2016. Each of the above-referenced applications is hereby incorporated herein by reference in its entirety.

TECHNICAL FIELD

The present technology relates to solid-state image sensors and imaging apparatuses. More particularly, the present technology relates to a CMOS solid-state image sensor and an imaging apparatus.

BACKGROUND ART

An imaging apparatus employing a complementary metal-oxide-semiconductor (CMOS) solid-state image sensor has been used in related art as an imaging apparatus such as cameras. This solid-state image sensor has a pixel array portion in which pixels, each of which includes a photoelectric conversion device for generating an electric charge corresponding to incident light, are arranged in a two-dimensional lattice pattern. The alternate execution of exposure in which a charge is generated by the photoelectric conversion device and signal readout in which a signal corresponding to the charge generated by the exposure is read out from the pixel makes it possible to obtain an image signal of one frame. For this solid-state image sensor, a solid-state image sensor including a charge retention region used to retain temporarily the charge generated by the photoelectric conversion device for each pixel is used.

In the solid-state image sensor described above, after the stop of the exposure period, the charges generated by the photoelectric conversion devices in all the pixels are retained in the charge retention region. Then, the charges retained in the charge retention region are transferred to a floating diffusion region in the pixel, and signal reading is performed on the transferred charges. Here, the floating diffusion region is a region to which an amplifier circuit for the signal readout is connected. In this manner, the charges generated in the photoelectric conversion device are retained simultaneously in the charge retention region in all the pixels, so the global shutter function can be achieved. Here, the global shutter is a function to simultaneously start and stop the exposure in all the pixels arranged in the solid-state imaging device. For such a solid-state image sensor, a solid-state image sensor in which a first transfer gate and a second transfer gate are arranged in a charge retention region has been developed. When the charge retained in the charge retention region is transferred to the floating diffusion, the application of a driving voltage and the stop of the application are performed sequentially with respect to the first and second transfer gates. In this manner, a system has been developed in which a potential gradient is generated inside the charge retention region to improve the charge transfer capability (e.g., refer to Patent Literature 1).

CITATION LIST

Patent Literature

Patent Literature 1: JP 2015-023250A

DISCLOSURE OF INVENTION

Technical Problem

In the related art described above, the noise contained in the image signal increases disadvantageously due to the influence of the dark current caused by the interface state formed on the surface of the charge retention region. In general, an interface state exists on the semiconductor surface on which the charge retention region or the like is formed, and the charge generated by the photoelectric conversion device is trapped in this interface state. The movement of charges between such interface states causes a signal component not due to the incident light to be included in the image signal. This signal component corresponds to the dark current described above. This dark current becomes noise superimposed on the image signal, so large dark current increases noise contained in the image signal.

The present technology is developed in view of such a situation, and is intended to transfer all charges retained in a charge retention region while reducing or eliminating the influence of dark current in a solid-state image sensor having a global shutter function.

Solution to Problem

The present technology is made in order to solve the above problem, and a first aspect of the present technology is a solid-state image sensor including: a photoelectric converter configured to generate a charge corresponding to an exposure amount during a predetermined exposure period; a generated-charge retention portion formed in a semiconductor region and configured to retain the charge; a generated-charge transfer portion configured to transfer the charge from the photoelectric converter to the generated-charge retention portion to perform generated-charge transfer by allowing electrical conduction between the photoelectric converter and the generated-charge retention portion after an elapse of the exposure period; an output charge retention portion configured to retain the charge; a retained-charge transfer portion configured to transfer the charge retained in the generated-charge retention portion to the output charge retention portion to perform retained-charge transfer by allowing electrical conduction between the generated-charge retention portion and the output charge retention portion; a signal generation portion configured to generate a signal corresponding to the charge retained in the output charge retention portion as an image signal after the retained-charge transfer; and a generated-charge retention gate portion configured to apply a control voltage for controlling potential of the generated-charge retention portion to the generated-charge retention portion during a period of the generated-charge transfer and the retained-charge transfer, apply a bias voltage having a polarity different from the control voltage to the generated-charge retention portion during a period different from the period of the generated-charge transfer and the retained-charge transfer, and apply the bias voltage to the generated-charge retention portion after applying an approximately intermediate voltage between the control voltage and the bias voltage to the generated-charge retention portion at an end of the period of the retained-charge transfer. This produces an effect that a bias voltage having a polarity different from the polarity of the control voltage is applied to the generated-charge retention portion during a period different from the period of the generated-charge transfer and the retained-charge transfer, and an approximately intermediate voltage between the control voltage and the bias voltage is applied to the generated-charge retention portion at the end of the period of the retained-charge transfer.

In addition, in the first aspect, the generated-charge retention gate portion may apply a voltage of approximately 0 V to the generated-charge retention portion as the approximately intermediate voltage between the control voltage and the bias voltage. This produces an effect that a voltage of approximately 0 V is applied as the approximately intermediate voltage between the control voltage and the bias voltage.

In addition, in the first aspect, the generated-charge retention gate portion may include a plurality of electrodes and, when a change in voltages to be applied at an end of the retained-charge transfer from the control voltage to the bias voltage is performed, may perform the change sequentially starting from an electrode arranged at a position far from the retained-charge transfer portion among the plurality of electrodes. This produces an effect that a voltage to be applied changes from the control voltage to the bias voltage sequentially from the electrode arranged at a position far from the retained-charge transfer portion among the plurality of electrodes.

In addition, in the first aspect, a semiconductor region arranged between the generated-charge retention portion and the generated-charge retention gate and formed to have a conductivity type different from a conductivity type of the semiconductor region in which the generated-charge retention portion is formed may be further included. This produces an effect that semiconductor regions formed in different conductivity types are arranged on the surface side of the semiconductor substrate on which the generated-charge retention portion is formed.

In addition, in the first aspect, a charge discharger configured to discharge the charge retained in the output charge retention portion before the retained-charge transfer may be further included. This produces an effect that the charge retained in the output charge retention portion is discharged before the retained-charge transfer.

In addition, in the first aspect, the charge discharger may be made nonconductive during the period of the retained-charge transfer for discharging the charge remaining in the generated-charge retention portion before the generated-charge transfer. This produces an effect that, when the charge remaining in the generated-charge retention portion is discharged to the output charge retention portion, the charge discharger is made nonconductive.

In addition, in the first aspect, the generated-charge retention gate portion may be applied with the control voltage before making the retained-charge transfer portion conductive in the retained-charge transfer. This produces an effect that the control voltage is applied to the generated-charge retention gate portion in a state where the retained-charge transfer portion is in a nonconductive state.

In addition, in the first aspect, the retained-charge transfer portion may further include a retained-charge transfer gate in which application of an on voltage used to make the retained-charge transfer portion conductive and application of an off voltage having a polarity different from a polarity of the on voltage are performed. This produces an effect that the off-voltage having a polarity opposite to the on-voltage is applied to the retained-charge transfer gate.

In addition, in the first aspect, in the retained-charge transfer portion, the off voltage may be applied to the retained-charge transfer gate after an approximately intermediate voltage between the on voltage and the off voltage is applied to the retained-charge transfer gate at the end of the period of the retained-charge transfer. This produces an effect that an approximately intermediate voltage between the on voltage and the off voltage is applied to the retained-charge transfer gate.

In addition, in the first aspect, in the retained-charge transfer portion, a voltage of approximately 0 V may be applied to the retained-charge transfer gate as the approximately intermediate voltage between the on-voltage and the off-voltage. This produces an effect that the voltage of approximately 0 V is applied to the retained-charge transfer gate as the intermediate voltage between the on voltage and the off voltage.

In addition, a second aspect of the present technology is an imaging apparatus including: a photoelectric converter configured to generate a charge corresponding to an exposure amount during a predetermined exposure period; a generated-charge retention portion formed in a semiconductor region and configured to retain the charge; a generated-charge transfer portion configured to transfer the charge from the photoelectric converter to the generated-charge retention portion to perform generated-charge transfer by allowing electrical conduction between the photoelectric converter and the generated-charge retention portion after an elapse of the exposure period; an output charge retention portion configured to retain the charge; a retained-charge transfer portion configured to transfer the charge retained in the generated-charge retention portion to the output charge retention portion to perform retained-charge transfer by allowing electrical conduction between the generated-charge retention portion and the output charge retention portion; a signal generation portion configured to generate a signal corresponding to the charge retained in the output charge retention portion as an image signal after the retained-charge transfer; a generated-charge retention gate portion configured to apply a control voltage for controlling potential of the generated-charge retention portion to the generated-charge retention portion during a period of the generated-charge transfer and the retained-charge transfer, apply a bias voltage having a polarity different from the control voltage to the generated-charge retention portion during a period different from the period of the generated-charge transfer and the retained-charge transfer, and apply the bias voltage to the generated-charge retention portion after applying an approximately intermediate voltage between the control voltage and the bias voltage to the generated-charge retention portion at an end of the period of the retained-charge transfer; and a processing circuit configured to process the generated signal. This produces an effect that the bias voltage having a polarity different from the control voltage is applied to the generated-charge retention portion during a period different from the period of the generated-charge transfer and the retained-charge transfer, and the approximately intermediate voltage between the control voltage and the bias voltage is applied to the generated-charge retention portion at the end of the period of the retained-charge transfer.

Advantageous Effects of Invention

According to the present technology, it is possible to achieve an advantageous effect of transferring all the charges retained in the charge retention region while reducing or eliminating the influence of the dark current in the solid-state image sensor having the global shutter function. Note that the effects described herein are not necessarily limited, and any of the effects described herein may be applied.

MODE(S) FOR CARRYING OUT THE INVENTION

The best modes for carrying out the present technology (hereinafter referred to as embodiments) will be described below. The description will be given in the following order.
1. First embodiment (an example in a case of having two generated-charge retention gates)
2. Second embodiment (an example in a case of different timings of applying a control electrode to a generated-charge retention gate)
3. Third embodiment (an example in a case of applying an intermediate voltage to a retained-charge transfer gate)
4. Fourth embodiment (an example in a case of having three generated-charge retention gates)
5. Fifth embodiment (an example in a case of having one generated-charge retention gate)
6. Sixth embodiment (an example in a case of sharing an output charge retention portion 111)
7. Modification 1. First Embodiment

[Configuration of Imaging Apparatus]

Figure 1:
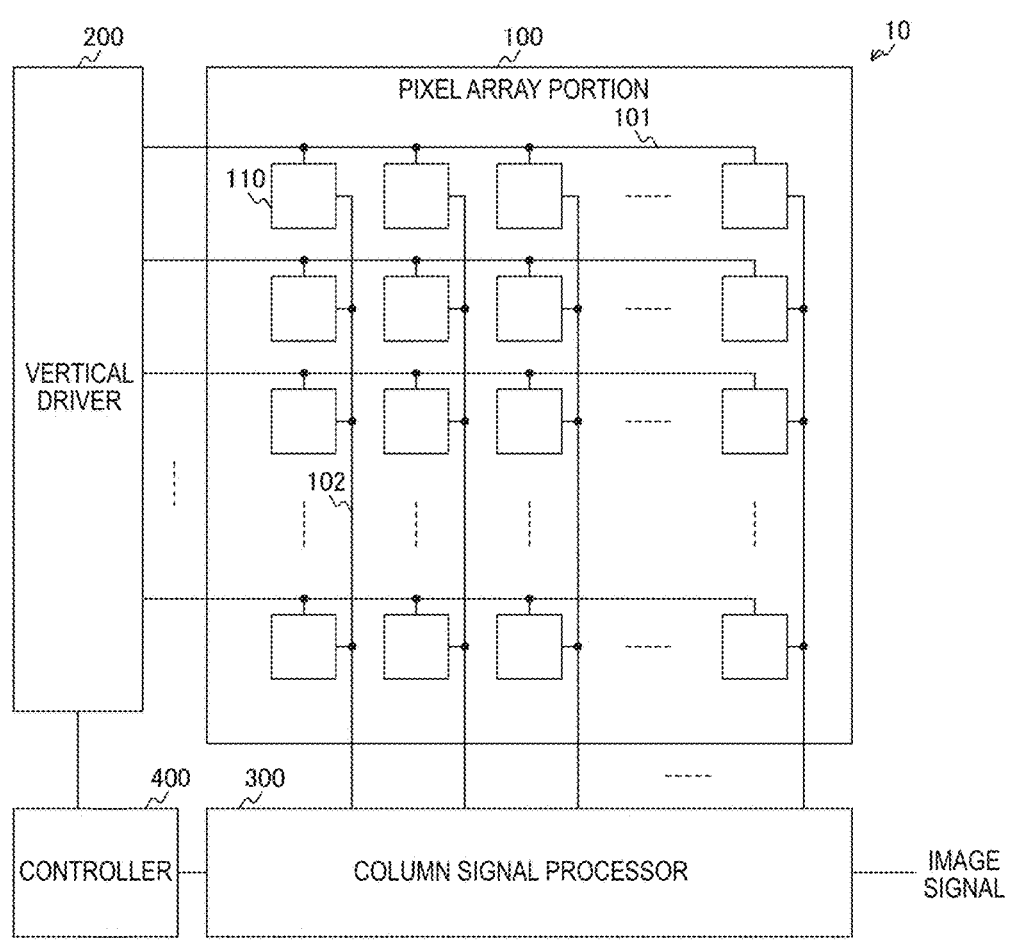
FIG. 1 is a diagram illustrating an exemplary configuration of an imaging apparatus 10 according to an embodiment of the present technology.

FIG. 1 is a diagram illustrating an exemplary configuration of an imaging apparatus 10 according to an embodiment of the present technology. The imaging apparatus 10 includes a pixel array portion 100, a vertical driver 200, a column signal processor 300, and a controller 400.

The pixel array portion 100 has pixels 110, each of which generates an image signal, arranged in a two-dimensional array. In the pixel array portion 100, a signal line 101 used to transmit a control signal to each pixel 110 and a signal line 102 used to transmit an image signal output from the pixel 110 are wired in an X-Y matrix pattern. In other words, one signal line 101 is wired in common to the pixels 110 arranged in the same row, and the outputs of the pixels 110 arranged in the same column are wired in common to one signal line 102. Moreover, the pixel array portion 100 is an example of the solid-state image sensor recited in the claims.

The vertical driver 200 generates a control signal and outputs it to the pixel array portion 100. The vertical driver 200 outputs the control signal to the signal lines 101 corresponding to all the rows of the pixel array portion 100. The output of the control signal by the vertical driver 200 can be divided into the output of signals for controlling the start and stop of exposure with respect to the pixels 110 of the pixel array portion 100 and the output of a signal for controlling readout of the image signal obtained by the exposure from the pixels 110. The signals for controlling the start and stop of the exposure are output simultaneously to all the pixels 110. This makes it possible to achieve the global shutter function in the imaging apparatus 10. On the other hand, the signals for controlling readout of the image signal are output sequentially to the pixels 110 arranged for each row in the pixel array portion 100 row by row. In other words, the image signals are read out sequentially for each row. Details of these control operations will be described later.

The column signal processor 300 processes the image signal generated by the pixel 110. The processing in the column signal processor 300 corresponds to analog-to-digital conversion or the like for converting an analog image signal generated by the pixel 110 into a digital image signal. The column signal processor 300 is supplied with the analog image signals or the like corresponding to the pixels 110 of one row of the pixel array portion 100 simultaneously as an input. The column signal processor 300 performs the analog-to-digital conversion on the input analog image signals or the like in parallel. Then, the column signal processor 300 transfers the converted digital image signal in the horizontal direction and outputs it. The digital image signal that is output from the column signal processor 300 is supplied to the outside as an output image signal of the imaging apparatus 10. Moreover, the column signal processor 300 is an example of the processing circuit recited in the claims.

The controller 400 controls the vertical driver 200 and the column signal processor 300.

[Circuit Configuration of Pixel]

Figure 2:
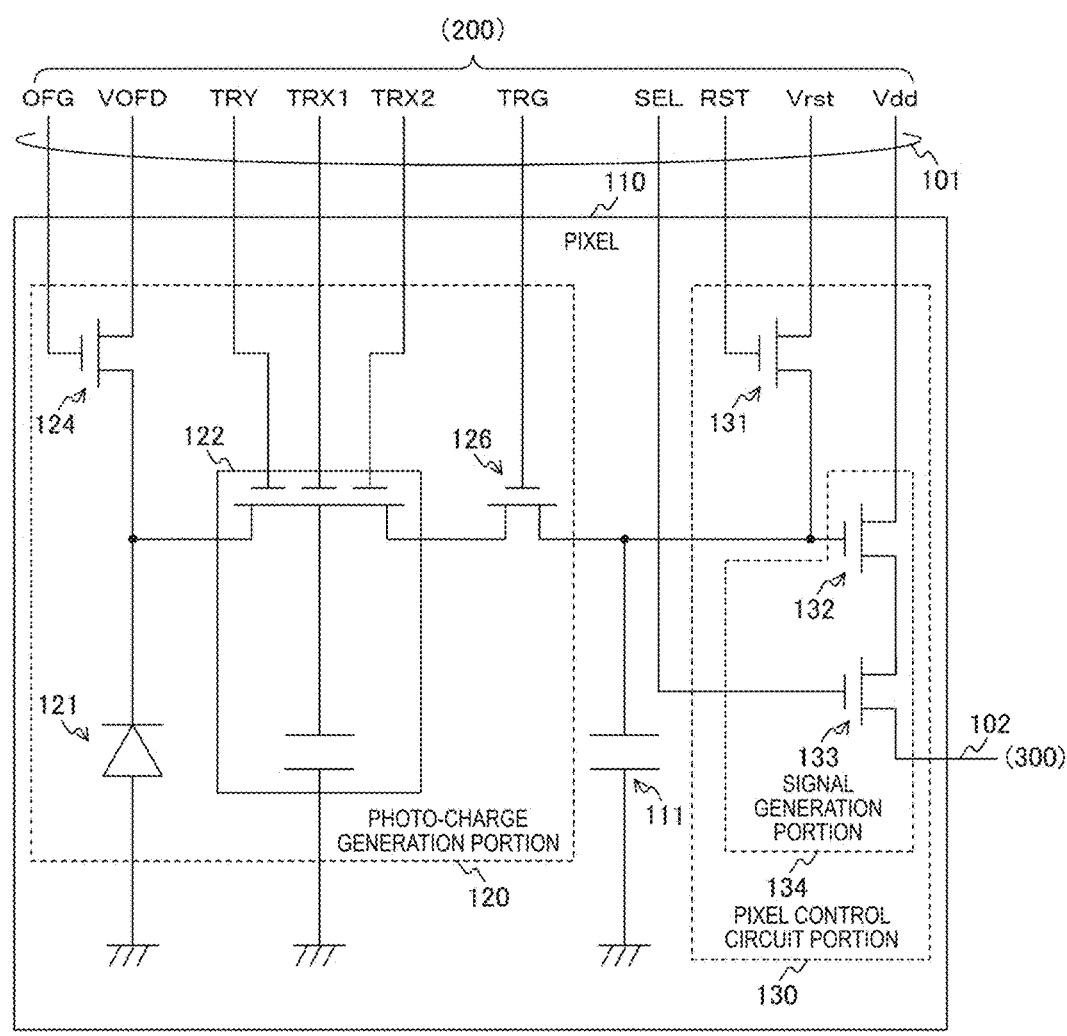
FIG. 2 is a diagram illustrating an exemplary configuration of a pixel 110 according to a first embodiment of the present technology.

FIG. 2 is a diagram illustrating an exemplary configuration of the pixel 110 according to a first embodiment of the present technology. This figure illustrates the circuit configuration of the pixel 110. The pixel 110 includes a photo-charge generation portion 120, an output charge retention portion 111, and a pixel control circuit portion 130.

The photo-charge generation portion 120 generates charges corresponding to the light irradiated to the pixel 110. The photo-charge generation portion 120 includes a photo-electric converter 121, an overflow gate 124, a charge retention portion 122, and a retained-charge transfer portion 126. Among them, the overflow gate 124 and the retained-charge transfer portion 126 can be constituted by an N-channel MOS transistor. Moreover, the charge retention portion 122 includes a generated-charge transfer portion 125, a generated-charge retention portion 156, and a generated-charge retention gate, which will be described later. Furthermore, the generated-charge transfer portion 125 includes a generated-charge transfer gate. It is assumed that the charge retention portion 122 in this figure includes a first generated-charge retention gate and a second generated-charge retention gate as the generated-charge retention gate.

The pixel control circuit portion 130 is a circuit that controls the pixel 110. The pixel control circuit portion 130 includes a charge discharger 131 and MOS transistors 132 and 133, which can be constituted by an N-channel MOS transistor. Moreover, the MOS transistors 132 and 133 constitute a signal generation portion 134.

The signal line 101 and the signal line 102 are connected to the pixel 110. The signal line 101 includes a plurality of signal lines (OFG, VOFD, TRY, TRX1, TRX2, TRG, SEL, RST, Vrst, and Vdd). The overflow gate signal line OFG (Overflow Gate) is a signal line for transmitting a control signal to the overflow gate 124. The transfer signal line TRY (Transfer-Y) is a signal line for transmitting a control signal to the generated-charge transfer gate of the charge retention portion 122. The transfer signal line TRG (Transfer-G) is a signal line for transmitting a control signal to the retained-charge transfer portion 126. The selection signal line SEL (Select) is a signal line for transmitting a control signal to the MOS transistor 133. The reset signal line RST (Reset) is a signal line for transmitting a control signal to the charge discharger 131. As illustrated in this figure, these signal lines are all connected to the gate of the MOS transistor. When a voltage that is equal to or higher than a threshold voltage between the gate and the source (hereinafter is referred to as on voltage) is inputted through these signal lines, the corresponding MOS transistor is made conductive.

The transfer signal lines TRX1 (Transfer-X1) and TRX2 (Transfer-X2) are signal lines for transmitting a control signal to the first generated-charge retention gate and the second generated-charge retention gate, respectively, of the charge retention portion 122. A control voltage, a bias voltage, and an approximately intermediate voltage therebetween, which will be described later, are applied to these signal lines. The signal line VOFD is a signal line for supplying a reset voltage of the photoelectric converter 121. In addition, the signal line VOFD is also used to discharge an excessive charge generated in the photoelectric converter 121. The signal line Vrst is a signal line for supplying a reset voltage of the output charge retention portion 111. The signal line Vdd is a signal line for supplying a power supply voltage to the MOS transistor 132. In addition, an image signal is output through the signal line 102.

The gate and drain of the overflow gate 124 are connected to the overflow gate signal line OFG and the signal line VOFD, respectively. The source of the overflow gate 124 is connected to the cathode of the photoelectric converter 121 and the source of the charge retention portion 122. The anode of the photoelectric converter 121 is grounded, and the generated-charge transfer gate of the charge retention portion 122 is connected to the transfer signal line TRY. The drain of the charge retention portion 122 is connected to the source of the retained-charge transfer portion 126. The first generated-charge retention gate and the second generated-charge retention gate of the charge retention portion 122 are connected to the transfer signal line TRX1 and the transfer signal line TRX2, respectively.

The gate of the retained-charge transfer portion 126 is connected to the transfer signal line TRG, and the drain thereof is connected to one end of the output charge retention portion 111, the source of the charge discharger 131, and the gate of the MOS transistor 132. The other end of the output charge retention portion 111 is grounded. The gate and the drain of the charge discharger 131 are respectively connected to the reset signal line RST and the signal line Vrst. The drain and the source of the MOS transistor 132 are respectively connected to the signal line Vdd and the drain of the MOS transistor 133. The gate and the source of the MOS transistor 133 are respectively connected to the selection signal line SEL and the signal line 102.

The photoelectric converter 121 generates charges corresponding to the exposure amount and retains generated-charges. The photoelectric converter 121 is constituted by a photodiode.

The overflow gate 124 discharges charges excessively generated in the photoelectric converter 121. In addition, the overflow gate 124 allows electrical conduction between the photoelectric converter 121 and the signal line VOFD to further discharge the charges accumulated in the photoelectric converter 121. The overflow gate 124 is controlled through the overflow gate signal line OFG.

The charge retention portion 122 retains the charge generated by the photoelectric converter 121. As illustrated in this figure, the charge retention portion 122 can be regarded as a MOS transistor having a capacitor whose one end is grounded. A region formed in the diffusion layer of the semiconductor substrate can be used as such equivalent capacitor. In addition, the charge retention portion 122 has the generated-charge transfer gate and the generated-charge retention gate, which are arranged therein. The generated-charge transfer gate is a gate for controlling the transfer of charges from the photoelectric converter 121. The generated-charge retention gate is a gate to which a control voltage that is a voltage for controlling the potential, a bias voltage that is a voltage having a polarity different from the control voltage, and an approximately intermediate voltage therebetween are applied. As described above, the first embodiment of the present technology is based on the assumption that the generated-charge retention gate is constituted by two gates of the first generated-charge retention gate and the second generated-charge retention gate. The first generated-charge retention gate and the second generated-charge retention gate are respectively controlled through the transfer signal line TRX1 and the transfer signal line TRX2. In addition, the generated-charge transfer gate is controlled through the transfer signal line TRY. Details of the configuration of the charge retention portion 122 will be described later.

The retained-charge transfer portion 126 transfers the charge retained in the charge retention portion 122 to the output charge retention portion 111 under the control of the transfer signal line TRG. The retained-charge transfer portion 126 transfers the charge by allowing the electrical conduction between the charge retention portion 122 and the output charge retention portion 111.

The output charge retention portion 111 retains the charge transferred by the retained-charge transfer portion 126. A region formed in the diffusion layer of the semiconductor substrate can be used as the output charge retention portion 111.

The charge discharger 131 discharges the charge retained in the output charge retention portion 111 under the control of the reset signal line RST. The charge discharger 131 discharges the charge by allowing the electrical conduction between the output charge retention portion 111 and the signal line Vrst.

The MOS transistor 132 outputs a voltage corresponding to the charge retained in the output charge retention portion 111 to the source. In addition, the MOS transistor 133 is controlled through the selection signal line SEL, and the voltage of the source of the MOS transistor 132 is output to the signal line 102 when the MOS transistor 133 is made conductive.

[Configuration of Pixel]

Figure 3:
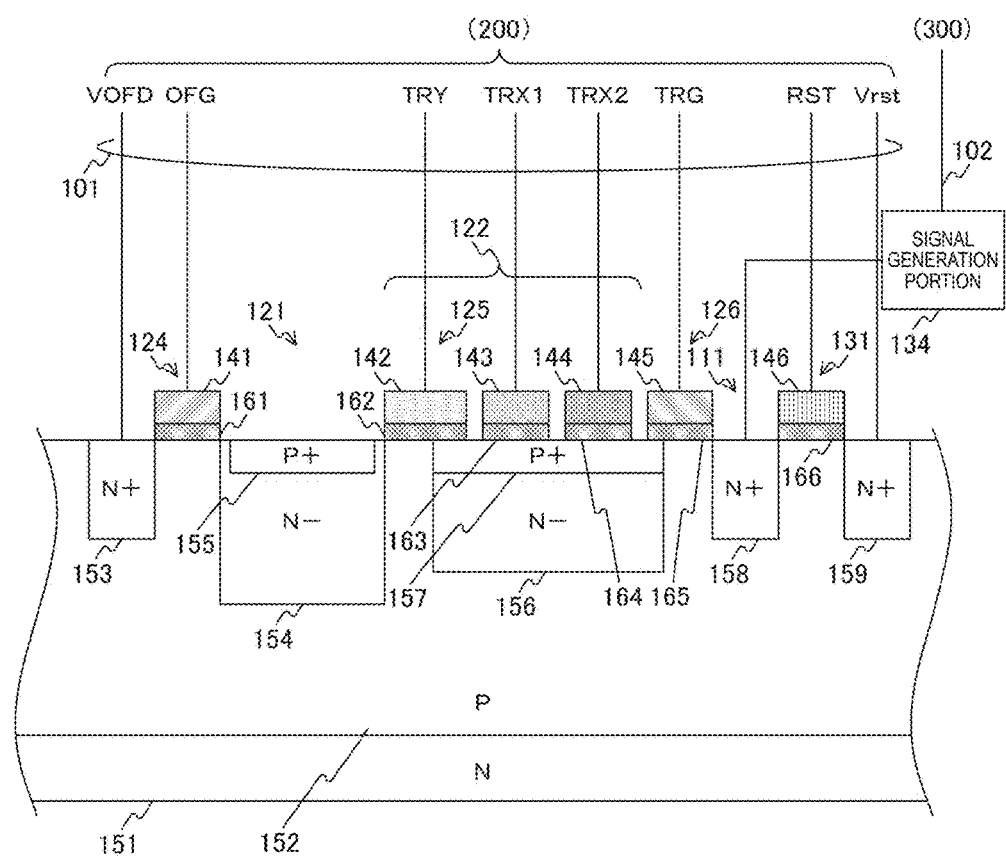
FIG. 3 is a cross-sectional view illustrating an exemplary configuration of the pixel 110 according to the first embodiment of the present technology.

FIG. 3 is a cross-sectional view illustrating an exemplary configuration of the pixel 110 according to the first embodiment of the present technology. This figure is a cross-sectional view schematically illustrating a configuration of the pixel 110 formed on a silicon semiconductor substrate. This figure illustrates a cross-sectional view of a part of the semiconductor substrate including the overflow gate 124, the photoelectric converter 121, the charge retention portion 122, the retained-charge transfer portion 126, the output charge retention portion 111, and the charge discharger 131. Furthermore, this figure illustrates the generated-charge transfer portion 125, the generated-charge retention portion 156, the first generated-charge retention gate 143, and the second generated-charge retention gate 144, which are included in the charge retention portion 122. The pixel 110 according to the first embodiment of the present technology can be configured by forming the above-described portions in a P-type well region 152 formed in, in one example, an N-type semiconductor substrate 151.

The photoelectric converter 121 is constituted by a photodiode having a P-N junction at the interface between the N-type semiconductor region 154 formed in the well region 152 and the P-type semiconductor region around the N-type semiconductor region 154. The incident of light on the P-N junction produces the charge. Electrons of the generated-charges are accumulated in the N-type semiconductor region 154. Moreover, a P-type semiconductor region 155 is formed on top of the N-type semiconductor region 154. The P-type semiconductor region 155 reduces or eliminates the dark current caused by the interface state by pinning the interface in the semiconductor.

The generated-charge retention portion 156 retains the charge generated by the photoelectric converter 121. The generated-charge retention portion 156 is constituted by an N-type semiconductor region formed in the well region 152. The generated-charge retention portion 156 has a potential gradient formed such that the potential is deepened from a region near the generated-charge transfer portion 125 toward a region near the retained-charge transfer portion 126. This is to facilitate the transfer of charges to the output charge retention portion 111. This potential gradient can be formed by changing the impurity concentration for each region. In addition, a P-type semiconductor region 157 is formed on top of the generated-charge retention portion 156. In other words, the P-type semiconductor region 157 is formed between the generated-charge retention portion 156 and the first generated-charge retention gate 143 or the like which will be described later. As can be seen from the figure, the generated-charge retention portion 156 has a structure that is embedded in the well region 152. The P-type semiconductor region 157 is arranged to perform the pinning of the semiconductor interface in the generated-charge retention portion 156. Thus, the P-type semiconductor region 157 is formed with a relatively high impurity concentration, for example, an impurity concentration of $10^{17}$ to $10^{18}/cm^3$.

The first generated-charge retention gate 143 and the second generated-charge retention gate 144 are arranged via silicon oxide films 163 and 164, respectively, on top of the P-type semiconductor region 157. As described above, the first generated-charge retention gate 143 and the second generated-charge retention gate 144 are used to apply the control voltage, the bias voltage, and the approximately intermediate voltage therebetween to the generated-charge retention portion 156. In this figure, the generated-charge retention portion 156 is constituted by an N-type semiconductor region, so the control voltage is a positive voltage and the bias voltage is a negative voltage. In addition, a voltage of approximately 0 V can be used as an approximately intermediate voltage between the control voltage and the bias voltage. The control voltage applied to the first generated-charge retention gate 143 or the like makes it possible to deepen the potential of the generated-charge retention portion 156 directly under the first generated-charge retention gate 143 or the like. The change in the potential during the charge transfer makes it possible to improve the transfer efficiency of charges.

In one example, when the charge is transferred from the photoelectric converter 121, the generated-charge transfer portion 125 described later is made conductive, and the control voltage is applied to the first generated-charge retention gate 143 and the second generated-charge retention gate 144. This allows the potential of the generated-charge retention portion 156 to be deeper than that of the photoelectric converter 121, so it is possible to perform the complete transfer that transfers all the charges retained in the photoelectric converter 121. Moreover, the transfer of charges from the photoelectric converter 121 to the generated-charge retention portion 156 is referred to as the generated-charge transfer, and the transfer of charges from the generated-charge retention portion 156 to the output charge retention portion 111 by the retained-charge transfer portion 126 is referred to as the retained-charge transfer.

As illustrated in this figure, in the case of a configuration having a plurality of generated-charge retention gates, the transfer of charges can be performed by sequentially applying voltages from the generated-charge retention gates arranged at positions far from the retained-charge transfer portion 126. Specifically, the charge transfer is performed as follows. First, the control voltage is applied to the first generated-charge retention gate 143 and the second generated-charge retention gate 144, and the retained-charge transfer portion 126 is made conductive. This allows most of the charges retained in the generated-charge retention portion 156 to be transferred to the output charge retention portion 111. Next, the voltage applied to the first generated-charge retention gate 143 is changed from the control voltage to the intermediate voltage and the bias voltage, sequentially. This allows a potential difference to occur in the generated-charge retention portion 156 directly under the first generated-charge retention gate 143 and the second generated-charge retention gate 144. Then, the potential gradient is increased due to the flange electric field effect, and so it is possible to transfer the charge remaining in the generated-charge retention portion 156 directly under the first generated-charge retention gate 143 to the generated-charge retention portion 156 directly under the second generated-charge retention gate 144. Then, the voltage applied to the second generated-charge retention gate 144 is changed from the control voltage to the intermediate voltage and the bias voltage, sequentially. As with the above case, the potential gradient can be increased, and so it is possible to transfer the charge remaining in the generated-charge retention portion 156 directly under the second generated-charge retention gate 144 to the output charge retention portion 111.

In this manner, at the end of the retained-charge transfer, the change in a voltage to be applied from the control voltage to the bias voltage is sequentially performed from the first generated-charge retention gate 143 arranged at a position far from the retained-charge transfer portion 126 makes it possible to transfer the charges. The details of the transfer of charges will be described later.

As described above, the control voltage is a voltage that is applied when the transfer of charges is performed in the generated-charge retention portion 156. Specifically, the control voltage is applied during the period of the above-described generation charge transfer and retained-charge transfer. On the other hand, the bias voltage is a voltage applied during a period different from the period of generated-charge transfer and retained-charge transfer. When the bias voltage is applied to the first generated-charge retention gate 143 and the second generated-charge retention gate 144, a negative voltage is applied to the P-type semiconductor region 157. This makes it possible to keep the effect of pinning by the P-type semiconductor region 157.

Further, in the embodiment of the present technology, the approximately intermediate voltage between the control voltage and the bias voltage is applied to the first generated-charge retention gate 143 or the like. This intermediate voltage is applied at the end of the retained-charge transfer period. Specifically, at the end of the retained-charge transfer period, the voltage applied to the first generated-charge retention gate 143 or the like changes in the order of the control voltage, the intermediate voltage, and the bias voltage. When the control voltage is applied to the first generated-charge retention gate 143 or the like, an inversion layer is formed in the generated-charge retention portion 156 near the interface with the silicon oxide film 163 or the like, and so a state where charges exist is obtained. Then, when the application of the intermediate voltage is omitted and the voltage applied to the first generated-charge retention gate 143 or the like is switched from the control voltage to the bias voltage, the charges existing near the interface disappear and are diffused to the generated-charge retention portion 156. This is prevented by applying the intermediate voltage before the application of the bias voltage. Moreover, the first generated-charge retention gate 143 and the second generated-charge retention gate 144 are an example of the generated-charge retention gate portion recited in the claims.

The generated-charge transfer portion 125 transfers the charge generated by the photoelectric converter 121 to the generated-charge retention portion 156 after the exposure period is elapsed. This generated-charge transfer portion 125 transfers the charge by allowing electrical conduction between the photoelectric converter 121 and the generated-charge retention portion 156. In this figure, the generated-charge transfer portion 125 has a P-type semiconductor region between the photoelectric converter 121 and the generated-charge retention portion 156 as a channel region, and a gate 142 is arranged on top of the channel region via a silicon oxide film 162. When the on voltage is applied to the gate 142 as a positive voltage, the generated-charge transfer portion 125 is made conductive. Thus, the charge accumulated in the N-type semiconductor region 154 of the photoelectric converter 121 is transferred to the generated-charge retention portion 156. In this manner, the generated-charge transfer portion 125 is equivalent to a MOS transistor having the N-type semiconductor region 154 and the generated-charge retention portion 156 as source and drain regions, respectively.

Moreover, the generated-charge transfer portion 125 can be made nonconductive by stopping the application of the voltage to the gate 142. In this event, the application of a voltage having a polarity different from that of the on voltage, that is, a negative voltage as the off voltage causes the non-conduction state to be ensured, so it is possible to prevent the reverse flow of charge from the generated-charge retention portion 156 to the photoelectric converter 121. In addition, as illustrated in this figure, the gate 142 can be arranged in the region overlying on top of the generated-charge retention portion 156 and the P-type semiconductor region 157. This makes it possible to deepen the potential of the generated-charge retention portion 156 when the generated-charge transfer portion 125 is made conductive, thereby facilitating the transfer of charges. In addition, in this case, the application of a negative off voltage to the gate 142 makes it possible to keep the pinning effect described above.

The output charge retention portion 111 includes an N-type semiconductor region 158 formed in the well region 152. The N-type semiconductor region 158 is called a floating diffusion and is a region to which the signal generation portion 134 is connected as illustrated in this figure. The N-type semiconductor region 158 has an impurity concentration higher than that of the generated-charge retention portion 156. Thus, the N-type semiconductor region 158 of the output charge retention portion 111 has a deeper potential than that of the generated-charge retention portion 156.

The retained-charge transfer portion 126 has a P-type semiconductor region between the generated-charge retention portion 156 and the output charge retention portion 111 as a channel region, and a retained-charge transfer gate 145 is arranged on top of the channel region via a silicon oxide film 165. When a positive voltage is applied to the retained-charge transfer gate 145, the retained-charge transfer portion 126 is made conductive. As a result, the charges retained in the generated-charge retention portion 156 are transferred to the N-type semiconductor region 158 of the output charge retention portion 111. In this manner, the retained-charge transfer portion 126 is equivalent to a MOS transistor having the generated-charge retention portion 156 and the N-type semiconductor region 158 as source and drain regions, respectively. The application of an off voltage that is a voltage having a polarity different from that of the on voltage to the retained-charge transfer gate 145 causes the non-conduction state of the retained-charge transfer portion 126 to be ensured. Thus, it is possible to prevent the reverse flow of charges from the output charge retention portion 111 to the generated-charge retention portion 156. In addition, as illustrated in this figure, the retained-charge transfer gate 145 can be arranged in the region overlying on top of the generated-charge retention portion 156 and the P-type semiconductor region 157. In this case, the application of a negative voltage to the retained-charge transfer gate 145 makes it possible to keep the pinning effect described above.

The charge discharger 131 has a P-type semiconductor region between the N-type semiconductor region 158 and the N-type semiconductor region 159 of the output charge retention portion 111 as a channel region, and a gate 146 is arranged on top of the channel region via the silicon oxide film 166. When a positive voltage is applied to the gate 146, the charge discharger 131 is made conductive. The signal line Vrst is connected to the N-type semiconductor region 159, so the charges retained in the N-type semiconductor region 158 of the output charge retention portion 111 are discharged to the signal line Vrst.

The overflow gate 124 has a P-type semiconductor region between the N-type semiconductor region 154 and the N-type semiconductor region 153 of the photoelectric converter 121 as a channel region, and a gate 141 is arranged on top of the channel region via a silicon oxide film 161. When a positive voltage is applied to this gate 141, the overflow gate 124 is made conductive. The signal line VOFD is connected to the N-type semiconductor region 153, so the charges retained in the N-type semiconductor region 154 of the photoelectric converter 121 are discharged to the signal line VOFD. It is possible to make the gate 141 nonconductive by applying a negative voltage to the gate 141 even in the overflow gate 124.

In the pixel 110, a wiring layer, an interlayer insulating layer, a light blocking metal, and the like are arranged in addition to the above-described components. Moreover, the gates 141, 145 and 146 can be constituted by polysilicon. Similarly, the first generated-charge retention gate 143, the second generated-charge retention gate 144, and the retained-charge transfer gate 145 can also be constituted by polysilicon.

[Signal Generation Processing]

Figure 4:
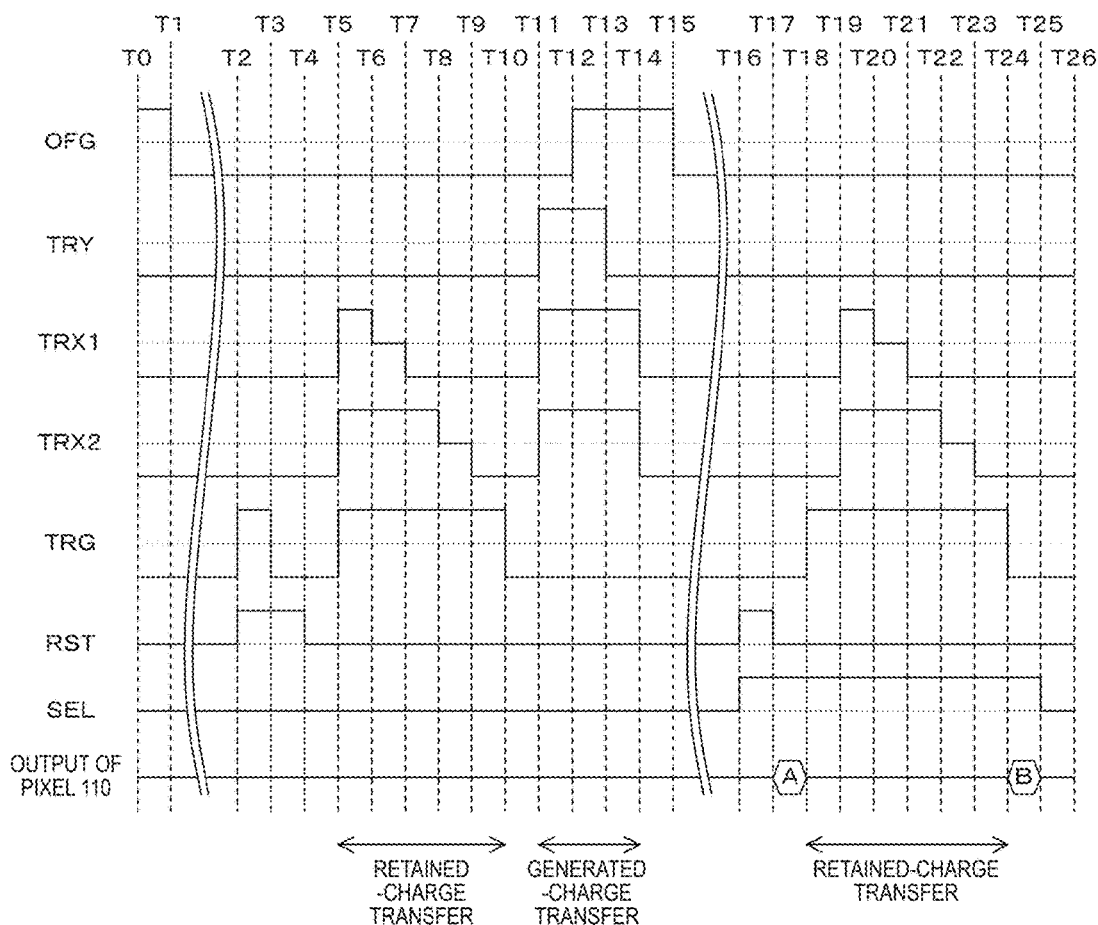
FIG. 4 is a diagram illustrating an example of signal generation processing according to the first embodiment of the present technology.

FIG. 4 is a diagram illustrating an example of signal generation processing according to the first embodiment of the present technology. This figure illustrates signal generation processing in the pixel 110 described with reference to FIG. 2. In this figure, the broken lines in the horizontal direction represent 0 V. In addition, symbols OFG, TRY, and TRG represent states of signals input to the overflow gate signal line OFG, the transfer signal line TRY, and the transfer signal line TRG, respectively. In this regard, a period of positive polarity represents application of an on voltage and a period of negative polarity represents application of an off voltage. TRX1 and TRX2 represent states of voltages applied to the transfer signal line TRX1 and the transfer signal line TRX2, respectively. In this regard, the period of positive polarity represents the control voltage, and the period of negative polarity represents the bias voltage. In addition, RST and SEL represent states of signals input to the selection signal line SEL and the reset signal line RST, respectively. In this regard, the period of positive polarity represents input of the on voltage. In addition, the output of the pixel 110 represents the state of the signal that is output to the signal line 102.

The signal generation processing shown in this figure is described with reference to FIGS. 5A, 5B, 5C, 5D, 5E, 6F, 6G, 6H, 6I, 6J, 7K, 7L, 8M, 8N, 8O, 8P, 8Q, 9R, 9S, 9T, 9U, and 9V.

Figure 5A:
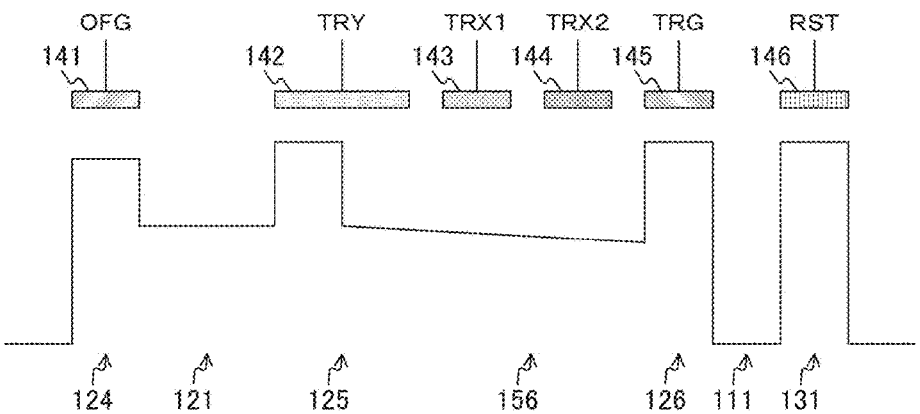
FIGS. 5A, 5B, 5C, 5D, and 5E are diagrams illustrating an operation state (period T0 to T4) of the pixel 110 according to the first embodiment of the present technology.

FIGS. 5A, 5B, 5C, 5D, and 5E are diagrams illustrating the operation state (period T0 to T4) of the pixel 110 according to the first embodiment of the present technology. FIGS. 6F, 6G, 6H, 6I, and 6J are diagrams illustrating the operation state (period T4 to T9) of the pixel 110 according to the first embodiment of the present technology. FIGS. 7K and 7L are diagrams illustrating the operation state (period T9 to T11) of the pixel 110 according to the first embodiment of the present technology. FIGS. 8M, 8N, 8O, 8P, and 8Q are diagrams illustrating the operation state (period T11 to T16) of the pixel 110 according to the first embodiment of the present technology. FIGS. 9R, 9S, 9T, 9U, and 9V are diagrams illustrating the operation state (period T16 to T21) of the pixel 110 according to the first embodiment of the present technology. FIGS. 10W, 10X, 10Y, and 10Z are diagrams illustrating the operation state (period T21 to T25) of the pixel 110 according to the first embodiment of the present technology. These figures are potential diagrams illustrating the operation states of the pixel 110. These figures show the states of the overflow gate 124, the photoelectric converter 121, the generated-charge transfer portion 125, the generated-charge retention portion 156, the retained-charge transfer portion 126, the output charge retention portion 111, and the charge discharger 131. The relationship between the gate 141 or the like and the potential is shown in FIG. 5A. The arrangement of them are the same as that in the semiconductor substrate described with reference to FIG. 3.

In the steady state, it is assumed that the off voltage is applied to the overflow gate signal line OFG, the transfer signal line TRY, and the transfer signal line TRG, and the bias voltage is applied to the transfer signal line TRX1 and the transfer signal line TRX2. Similarly, it is assumed that the voltage of 0 V is applied to the reset signal line RST and the selection signal line SEL.

Figure 5B:
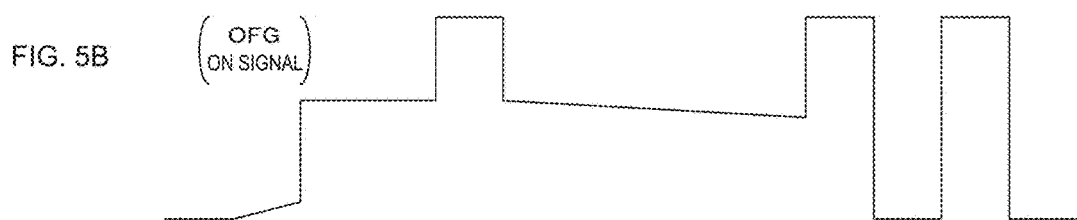

During the period T0 to T1, the on voltage is applied to the overflow signal line OFG, so the overflow gate 124 is made conductive (FIG. 5B). This allows the photoelectric converter 121 to be reset, and the exposure is started.

Figure 5C:
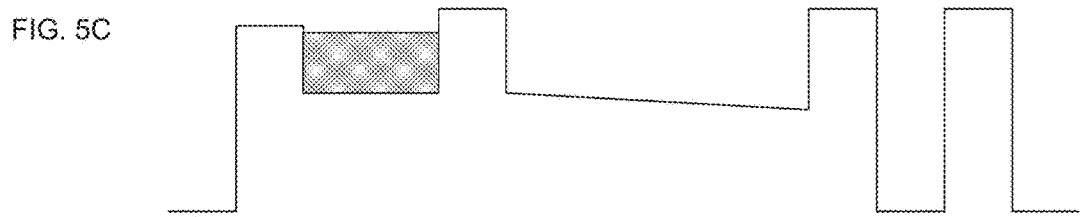

During the period T1 to T2, the exposure is performed for a predetermined period, and charges are retained in the photoelectric converter 121 (FIG. 5C).

Figure 5D:
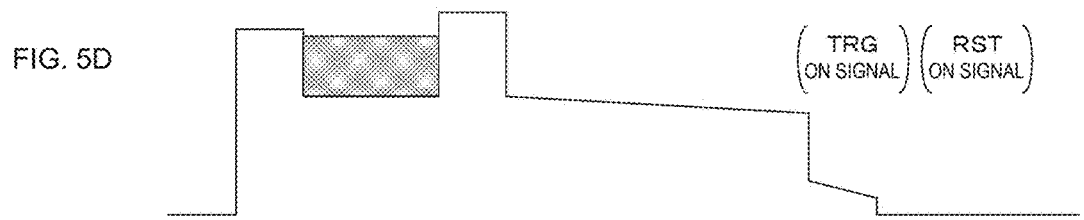
Figure 5E:
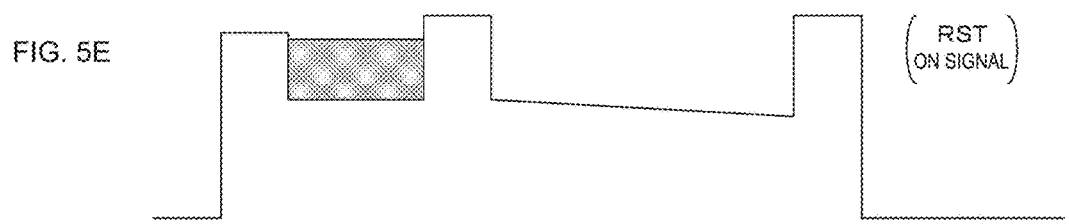

During the period T2 to T5, the on voltage is applied to the transfer signal line TRG and the reset signal line RST, and the retained-charge transfer portion 126 and the charge discharger 131 are made conductive (period T2 to T3 in FIG. 5D). This allows the charge retained in the output charge retention portion 111 to be discharged. Then, the application of the on voltage of the transfer signal line TRG and the reset signal line RST is sequentially stopped (period T3 to T5 in FIG. 5E and FIG. 6F).

Figure 6F:
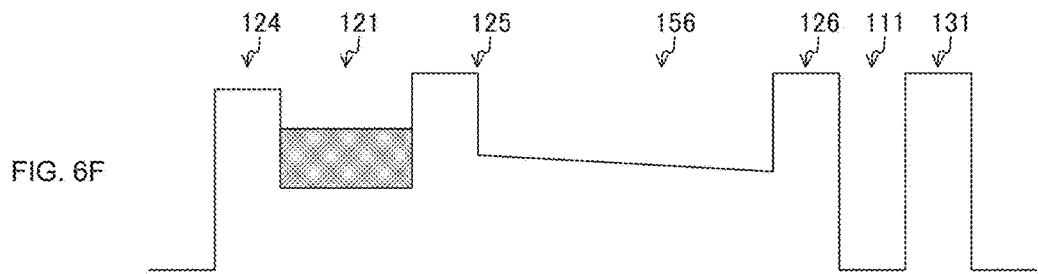
FIGS. 6F, 6G, 6H, 6I, and 6J are diagrams illustrating an operation state (period T4 to T9) of the pixel 110 according to the first embodiment of the present technology.
Figure 6G:
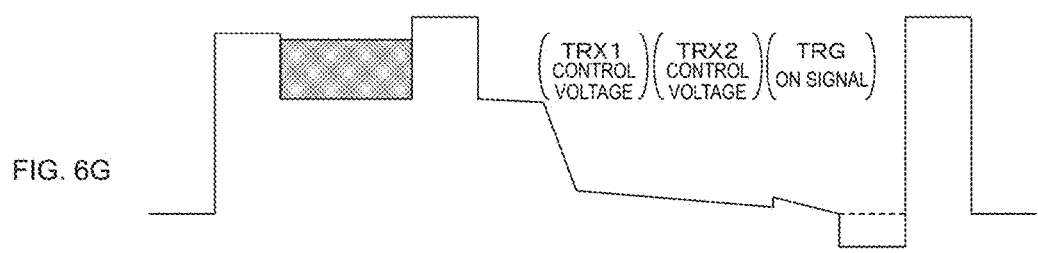
Figure 7K:
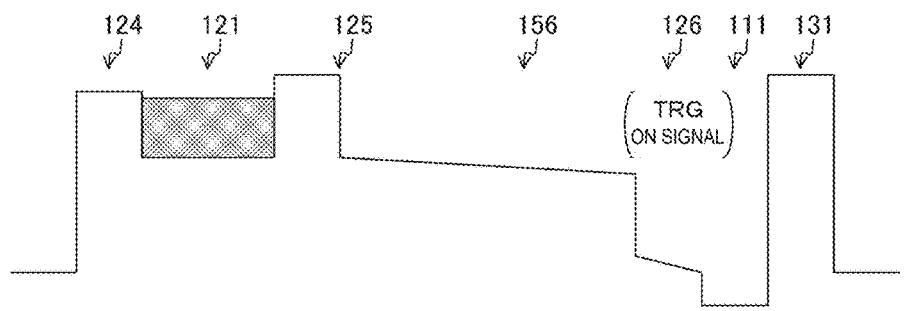
FIGS. 7K and 7L are diagrams illustrating an operation state (period T9 to T11) of the pixel 110 according to the first embodiment of the present technology.
Figure 7L:
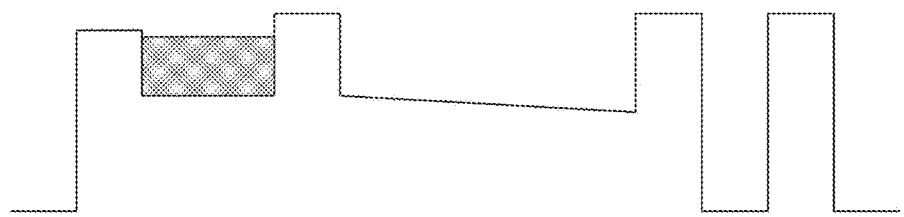

During the period T5 to T6, the control voltage is applied to the transfer signal line TRX1 and the transfer signal line TRX2, and the on voltage is applied to the transfer signal line TRG (FIG. 6G). This allows the potential of the generated-charge retention portion 156 to be deepened and the retained-charge transfer portion 126 to be made conductive. In this event, the output charge retention portion 111 is influenced by a change in the potential of the capacitance-coupled generated-charge retention portion 156, so it has a deeper potential than in the steady state. This is because the charge discharger 131 is made nonconductive, so the output charge retention portion 111 is in a so-called floating state. The dotted line of FIG. 6G represents the potential of the output charge retention portion 111 in the steady state. This makes it possible to prevent the reverse flow of charges from the output charge retention portion 111 to the generated-charge retention portion 156.

Figure 6H:
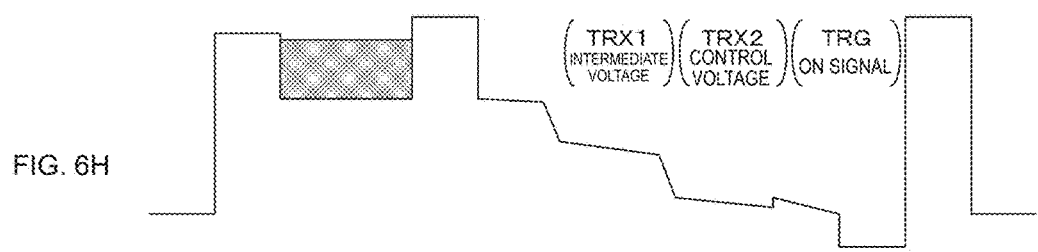
Figure 6I:
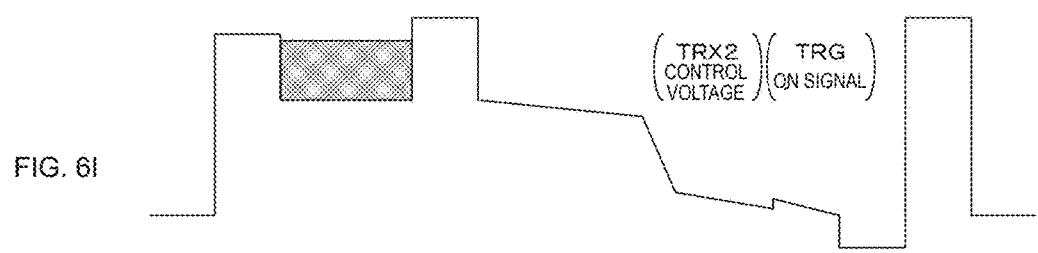
Figure 6J:
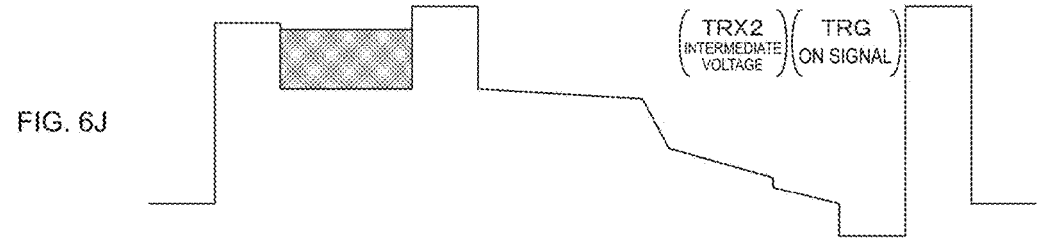

During the period T6 to T11, the intermediate voltage (0 V) is applied to the transfer signal line TRX1 (period T6 to T7 FIG. 6H). The flange electric field effect allows the potential gradient of the part of the generated-charge retention portion 156 directly under the first generated-charge retention gate 143 to be large, and so the charge remaining in this part is transferred. Next, the application of the intermediate voltage to the transfer signal line TRX1 is stopped (period T7 to T8 FIG. 6I), and the intermediate voltage is applied to the transfer signal line TRX2 (period T8 to T9 FIG. 6J). This allows the potential gradient of the part of the generated-charge retention portion 156 directly under the second generated-charge retention gate 144 to be increased, and so the charge remaining in this part is transferred. Next, the application of the intermediate voltage to the transfer signal line TRX2 is stopped (period T9 to T10 in FIG. 7K). Then, the application of the on voltage to the transfer signal line TRG is stopped (period T10 to T11 in FIG. 6I). This allows the charges retained in the generated-charge retention portion 156 to be transferred to the output charge retention portion 111, and so the generated-charge retention portion 156 is reset.

Figure 8M:
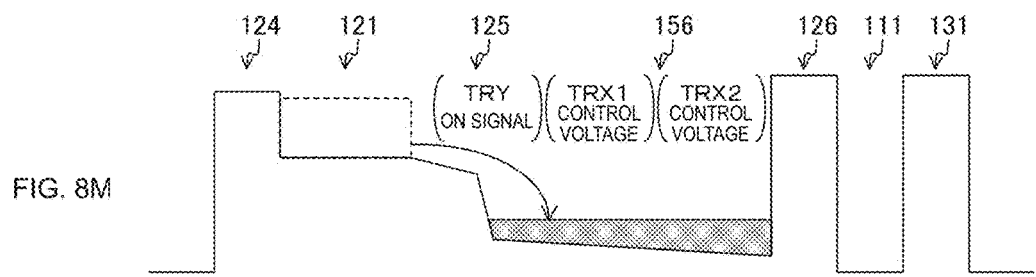
FIGS. 8M, 8N, 8O, 8P, and 8Q are diagrams illustrating an operation state (11 to T16) of the pixel 110 according to the first embodiment of the present technology.

During the period T11 to T12, the on voltage is applied to the transfer signal line TRY, and the control voltage is applied to the transfer signal line TRX1 and the transfer signal line TRX2 (in FIG. 8M). This allows the generated-charge transfer portion 125 to be made conductive and the potential of the generated-charge retention portion 156 to be deepened. Thus, the charges retained in the photoelectric converter 121 are transferred to the generated-charge retention portion 156. Moreover, the period T1 to T11 correspond to the exposure period. In other words, the period from the transition of the overflow gate 124 to the non-conduction state to the transition of the generated-charge transfer portion 125 to the conduction state corresponds to the exposure period.

Figure 8N:
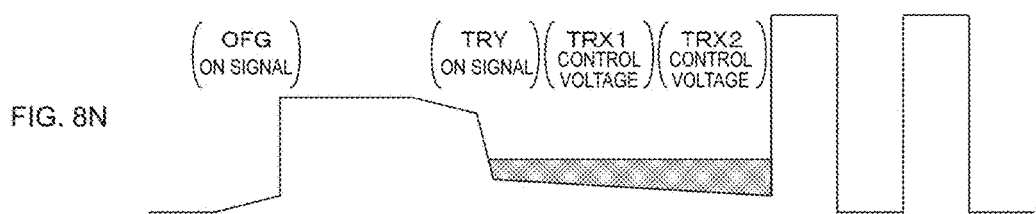
Figure 8O:
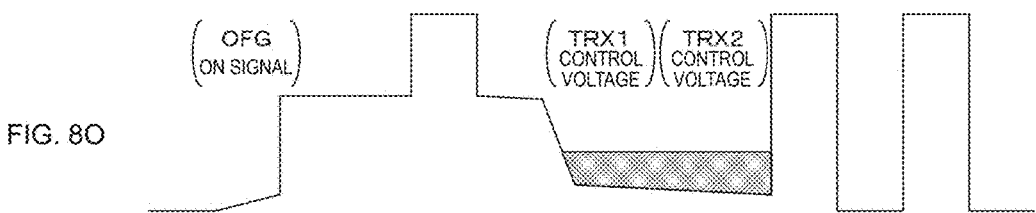
Figure 8P:
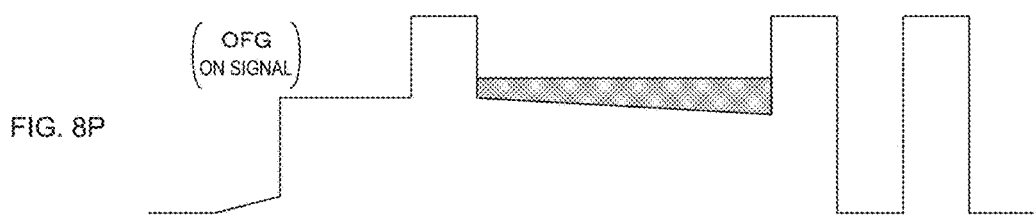
Figure 8Q:
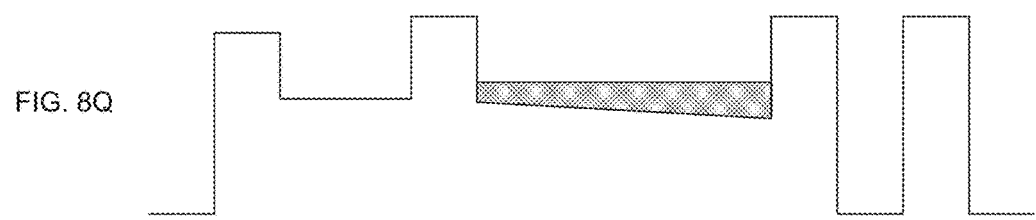
Figure 9R:
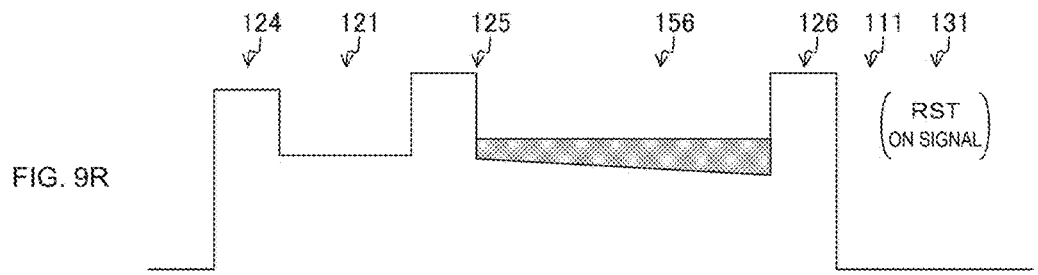
FIGS. 9R, 9S, 9T, 9U, and 9V are diagrams illustrating an operation state (period T16 to T21) of the pixel 110 according to the first embodiment of the present technology.
Figure 9S:
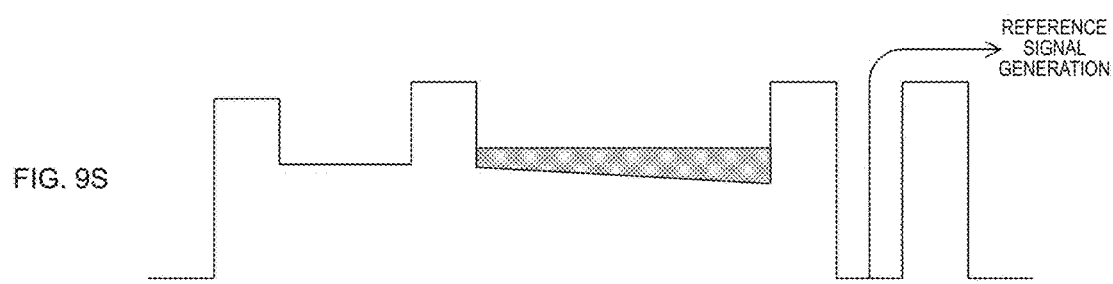
Figure 9T:
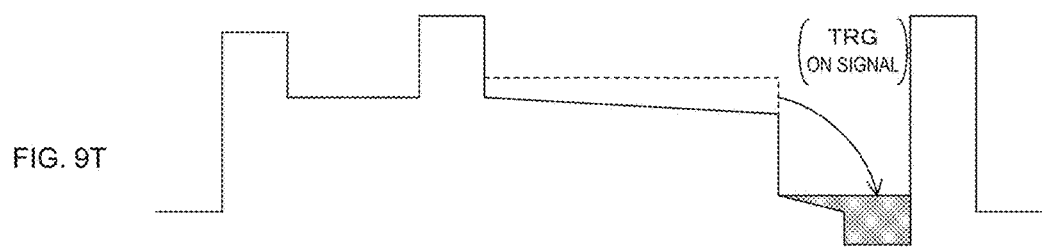
Figure 9U:
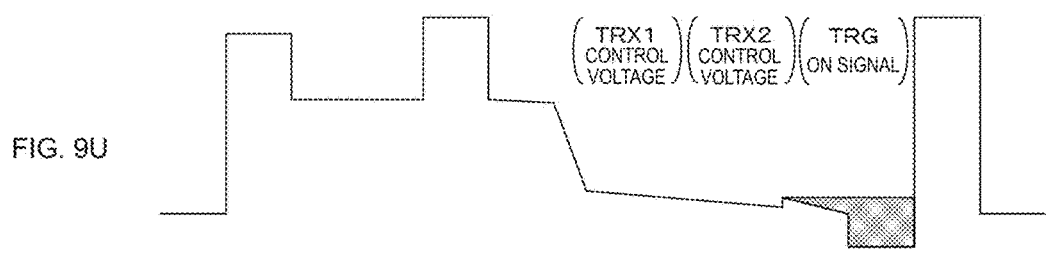
Figure 9V:
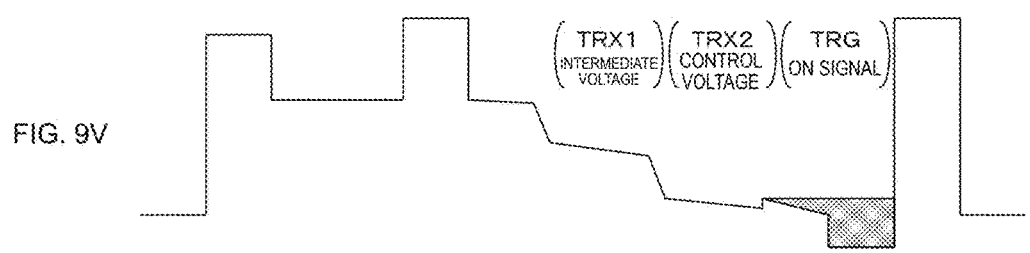
Figure 10W:
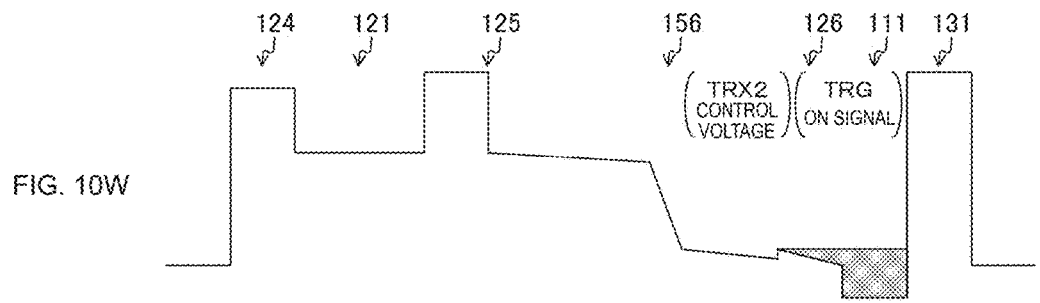
FIGS. 10W, 10X, 10Y, and 10Z are diagrams illustrating an operation state (period T21 to T25) of the pixel 110 according to the first embodiment of the present technology.
Figure 10X:
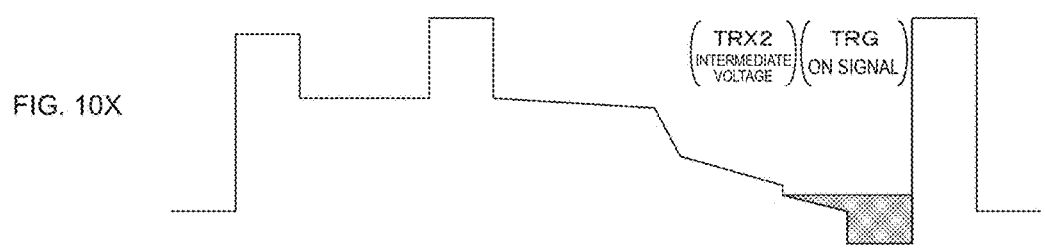
Figure 10Y:
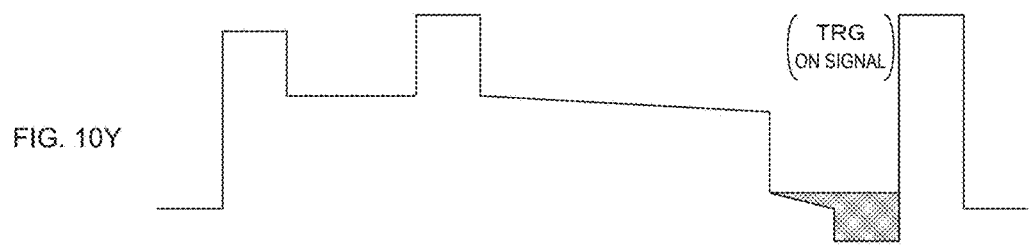
Figure 10Z:
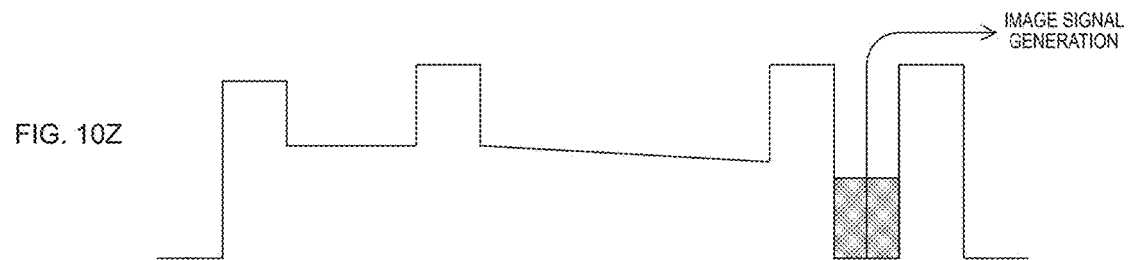

During the period T12 to T16, the on voltage is applied to the overflow gate signal line OFG and the overflow gate 124 is made conductive (period T12 to T15 in FIGS. 8N, 8O, and 8P). This allows the photoelectric converter 121 to be reset. In addition, the application of the on voltage to the transfer signal line TRY is stopped (period T13 to T14 in FIG. 8O), and the application of the control voltage to the transfer signal line TRX1 and the transfer signal line TRX2 is stopped (period T14 to T15 in FIG. 8P). Then, the application of the on voltage to the overflow gate signal line OFG is stopped (period T15 to T16 in FIG. 8O). This allows a new exposure period to be started.

During the period T16 to T26, the on voltage is applied to the selection signal line SEL, and the MOS transistor 133 of the signal generation portion 134 is made conductive (period T16 to T25). This allows a signal corresponding to the charge retained in the output charge retention portion 111 to be output from the pixel 110. In addition, the on voltage is applied to the reset signal line RST, and the charge discharger 131 is made conductive (period T16 to T17 in FIG. 9R). This allows the charges retained in the output charge retention portion 111 to be discharged, and so the output charge retention portion 111 is reset. Next, the application of the on voltage to the reset signal line RST is stopped (period T17 to T18 in FIG. 9S), and a signal corresponding to the charge retained in the output charge retention portion 111 after the reset is output. In FIG. 4, this signal is represented as "A". This signal is a reference signal of the image signal output from the pixel 110, and is stored in the column signal processor 300 described with reference to FIG. 1.

Next, the on voltage is applied to the transfer signal line TRG, the retained-charge transfer portion 126 is made conductive (period T18 to T19 in FIG. 9T), and the charges retained in the generated-charge retention portion 156 are transferred to the output charge retention portion 111. Furthermore, the control voltage is applied to the transfer signal line TRX1 and the transfer signal line TRX2 (period T19 to T20 in FIG. 9U). Next, the intermediate voltage (0 V) is applied to the transfer signal line TRX1 (period T20 to T21 in FIG. 9V). Next, the application of the intermediate voltage to the transfer signal line TRX1 is stopped (period T21 to T22 in FIG. 10W), and the intermediate voltage is applied to the transfer signal line TRX2 (period T22 to T23 in FIG. 10X). Next, the application of the intermediate voltage to the transfer signal line TRX2 is stopped (period T23 to T24 in FIG. 10Y), and the application of the on voltage to the transfer signal line TRG is stopped (period T24 to T25 in FIG. 10Z). This allows all the charges retained in the generated-charge retention portion 156 to be transferred to the output charge retention portion 111.

In this event, a signal corresponding to the charge retained in the output charge retention portion 111 is output. In FIG. 4, this signal is represented as "B". This signal is an image signal corresponding to the exposure amount in the pixel 110. In the column signal processor 300, the reference signal "A" is subtracted from the image signal "B". This makes it possible to remove the signal component specific to the pixel 110 from the image signal. This is a method called correlated double sampling (CDS). Finally, the application of the on voltage to the selection signal line SEL is stopped (period T25 to T26), and the state returns to the steady state.

Among these processing steps, the processing during the period T0 to T16 is processing steps executed simultaneously for all the pixels 110 arranged in the pixel array portion 100. On the other hand, the processing during the period T16 to T26 is processing steps executed sequentially for each row. In addition, the charge transfer during the periods T5 to T10 and T18 to T24 corresponds to the retained-charge transfer described with reference to FIG. 2. Among them, the retained-charge transfer during the period T18 to T24 corresponds to the retained-charge transfer after the exposure. As described above, the intermediate voltage is applied to the generated-charge retention portion 156 at the end of the period of the retained-charge transfer. In addition, the charge transfer during the period T11 to T14 corresponds to the generated-charge transfer described with reference to FIG. 2.

Figure 11A:
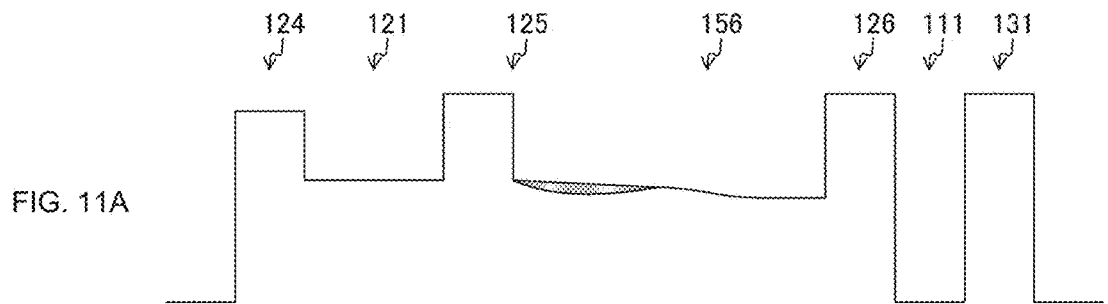
FIGS. 11A, 11B, 11C, and 11D are diagrams illustrating an operation state (period T19 to T22) of the pixel 110 according to the first embodiment of the present technology.

FIGS. 11A, 11B, 11C, and 11D are diagrams illustrating another example of the operation state (period T19 to T22) of the pixel 110 according to the first embodiment of the present technology. This figure illustrates the operation state in the case where the potential of the generated-charge retention portion 156 has unevenness. As described above, the formation of a concentration gradient of the impurity in the generated-charge retention portion 156 allows a potential gradient from the generated-charge transfer portion 125 side to the retained-charge transfer portion 126 to be formed. However, when the gradient of impurity concentration is not properly formed, unevenness of the potential as shown in FIG. 11A occurs. FIG. 11A illustrates an example in which charges remain in this recess.

Figure 11B:
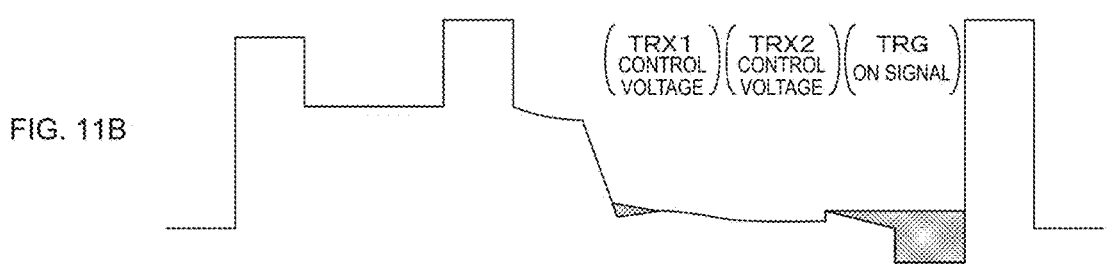
Figure 11C:
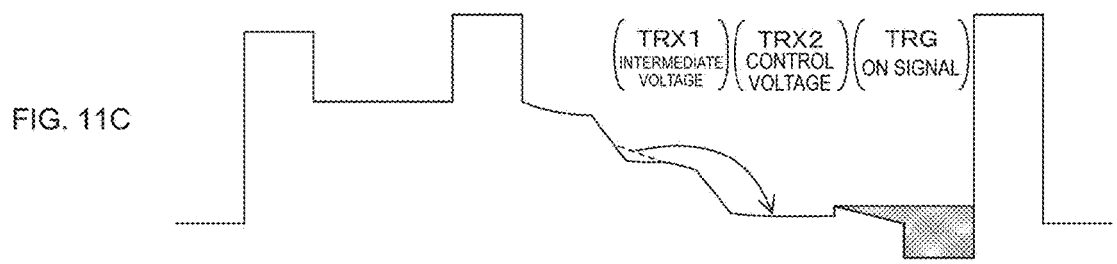
Figure 11D:
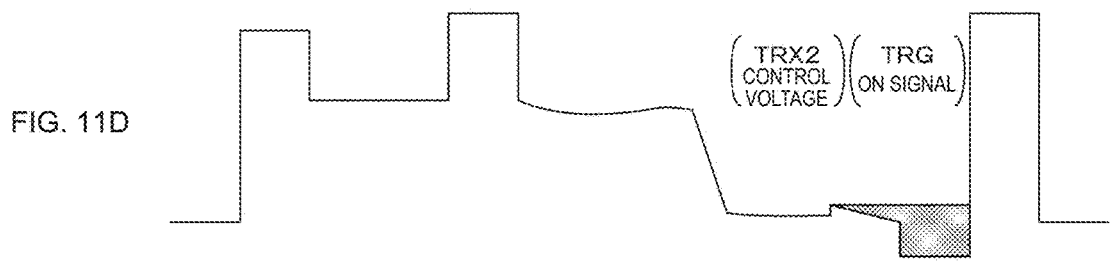

During the period T19 to T20, the control voltage is applied to the transfer signal lines TRX1 and TRX2, and the on voltage is applied to the transfer signal line TRG (period T19 to 20, in FIG. 11B). Next, the intermediate voltage is applied to the transfer signal line TRX1 (period T20 to T21 in FIG. 11C). As described above, the potential gradient of the part of the generated-charge retention portion 156 directly under the first generated-charge retention gate 143 becomes large, and the charge remaining in the recess of the potential is transferred. Then, the application of the intermediate voltage to the transfer signal line TRX1 is stopped (period T21 to T22 in FIG. 11D). The signal generation processing other than that described above is similar to the processing described in FIG. 4, so a description thereof will be omitted.

In this manner, the application of the intermediate voltage makes it possible to transfer the charges remaining in the recess of the potential, thereby achieving the complete transfer of charges. In this event, the period during which the intermediate voltage is applied can be, in one example, a period necessary for transferring the charges remaining in the generated-charge retention portion 156 directly under the first generated-charge retention gate 143 described above. Moreover, in the case where the voltage to be applied is changed from the control voltage to the bias voltage without applying the intermediate voltage to the transfer signal line TRX1 during the period T20 to T21, the charges remaining in the recess of the potential keep in the recess of the original potential without being transferred.

[Arrangement of Pixels]

Figure 12:
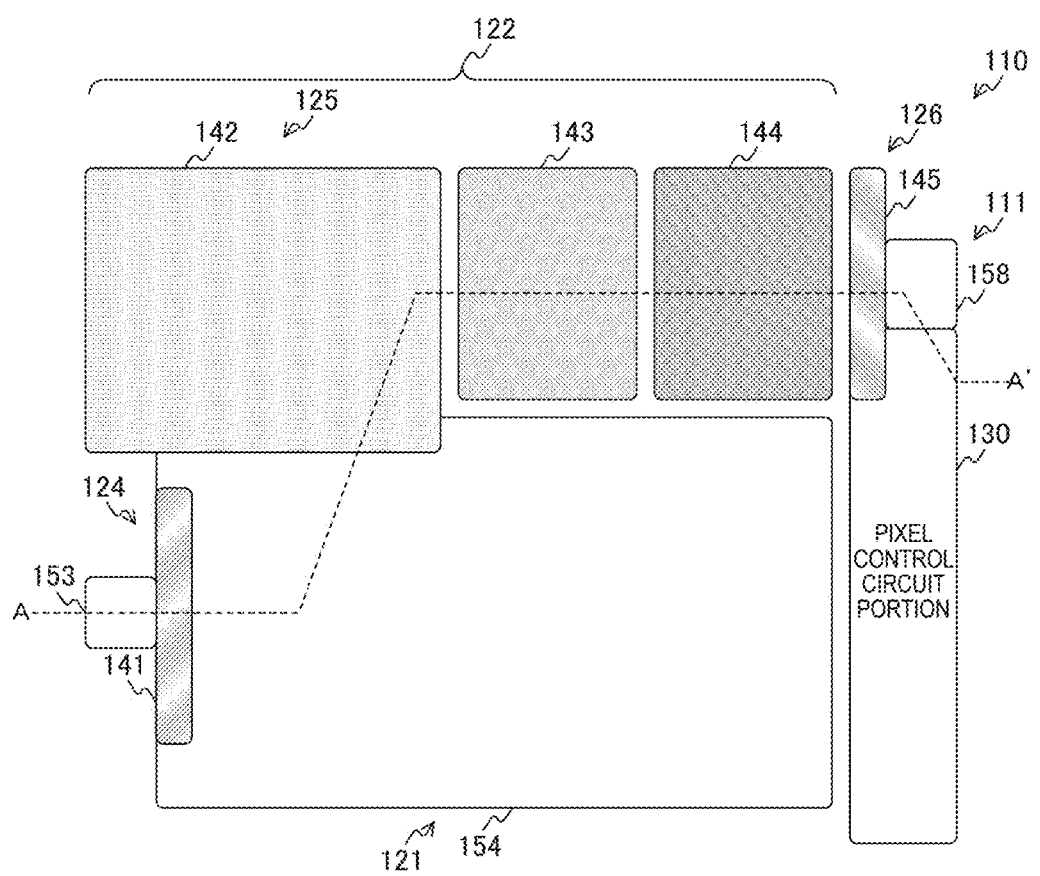
FIG. 12 is a plan view illustrating an exemplary configuration of the pixel 110 according to the first embodiment of the present technology.

FIG. 12 is a plan view illustrating an exemplary configuration of the pixel 110 according to the first embodiment of the present technology. This figure schematically illustrates the arrangement of the pixels 110 in the surface of the semiconductor substrate. Moreover, the cross-sectional view of the pixel 110 taken along the line A-A' in FIG. 12 corresponds to FIG. 3. The N-type semiconductor region 154 of the photoelectric converter 121 is arranged on the lower side of this figure. The gate 141 of the overflow gate 124 and the N-type semiconductor region 153 are arranged sequentially to be adjacent to each other on the left side of the photoelectric converter 121. The gate 142 of the generated-charge transfer portion 125 is arranged on the upper left of the photoelectric converter 121. The first generated-charge retention gate 143 and the second generated-charge retention gate 144 are arranged sequentially to be adjacent to each other on the right side of the generated-charge transfer portion 125. The retained-charge transfer gate 145 of the retained-charge transfer portion 126 and the N-type semiconductor region 158 of the output charge retention portion 111 are sequentially arranged to be adjacent to the generated-charge retention gate 144. The pixel control circuit portion 130 is arranged below the output charge retention portion 111.

[Manufacturing Process of Pixel]

Figure 13A:
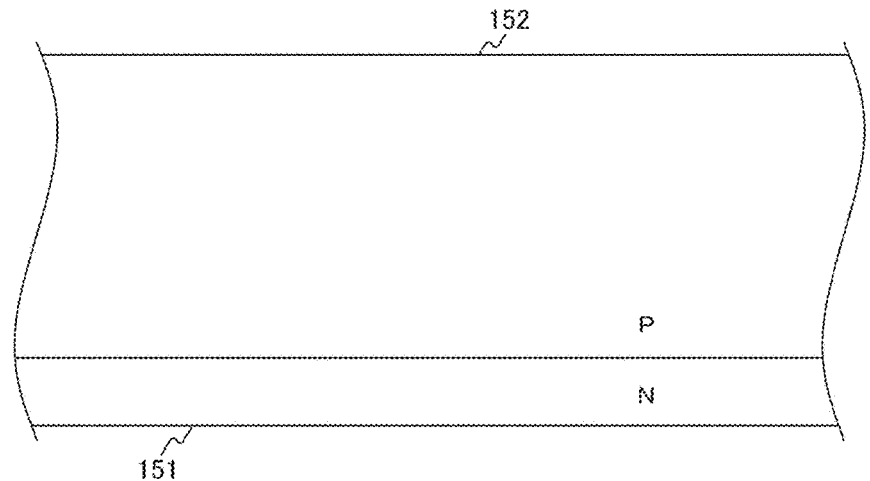
FIGS. 13A, 13B, and 13C are diagrams illustrating an example of a manufacturing process of the pixel 110 according to the first embodiment of the present technology.
Figure 13B:
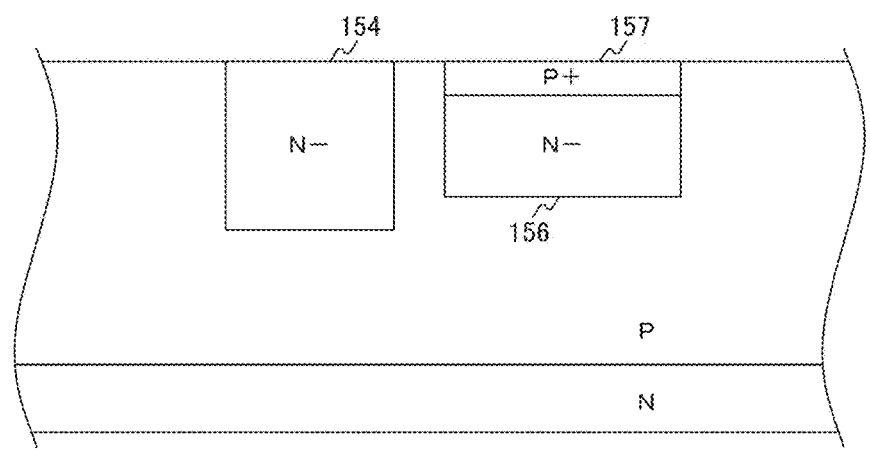
Figure 13C:
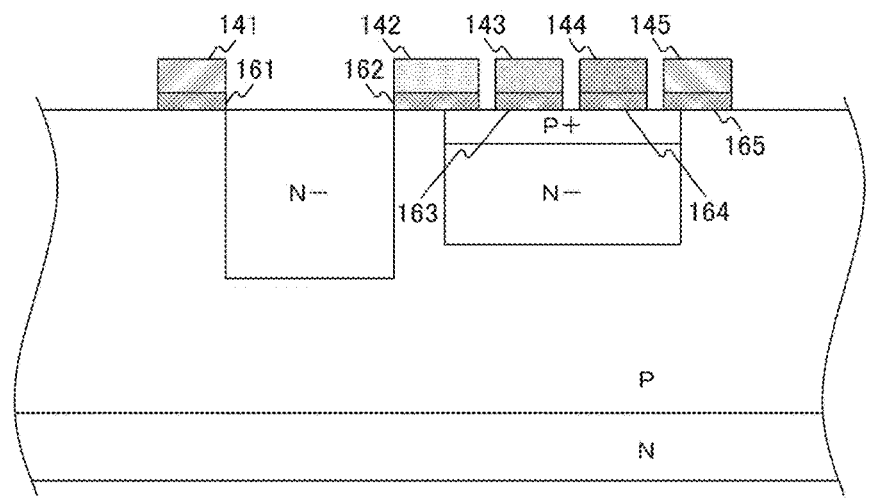

FIGS. 13A, 13B, and 13C are diagrams illustrating an example of a manufacturing process of the pixel 110 according to the first embodiment of the present technology. First, the P-type well region 152 is formed in the N-type semiconductor substrate 151 (FIG. 13A). This can be formed using ion implantation. Next, the N-type semiconductor region 154, the generated-charge retention portion 156, and the P-type semiconductor region 157 are formed in the well region 152 (FIG. 13B). They can be formed using the ion implantation. Next, the silicon oxide films 161 to 165, the generated-charge retention gates 143 and 144, the retained-charge transfer gate 145, the gate 141, and the like are formed (FIG. 13C). They can be formed by etching after forming the silicon oxide film and the polysilicon film.

Figure 14D:
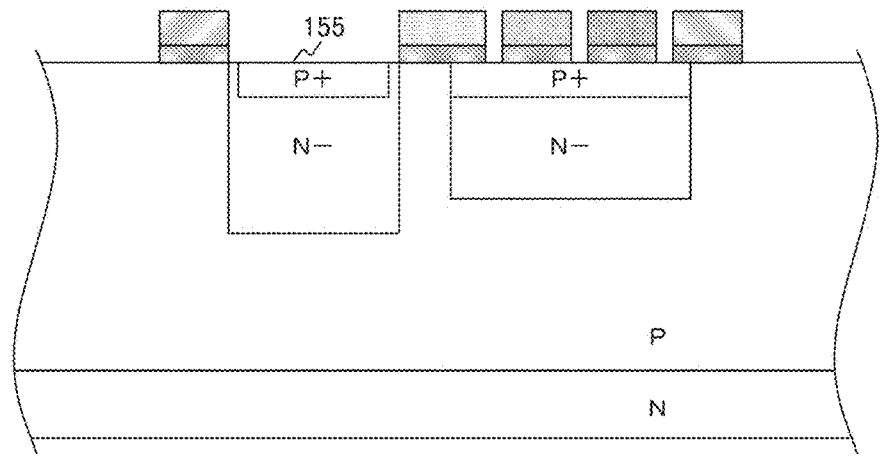
FIGS. 14D and 14E are diagrams illustrating an example of a manufacturing process of the pixel 110 according to the first embodiment of the present technology.
Figure 14E:
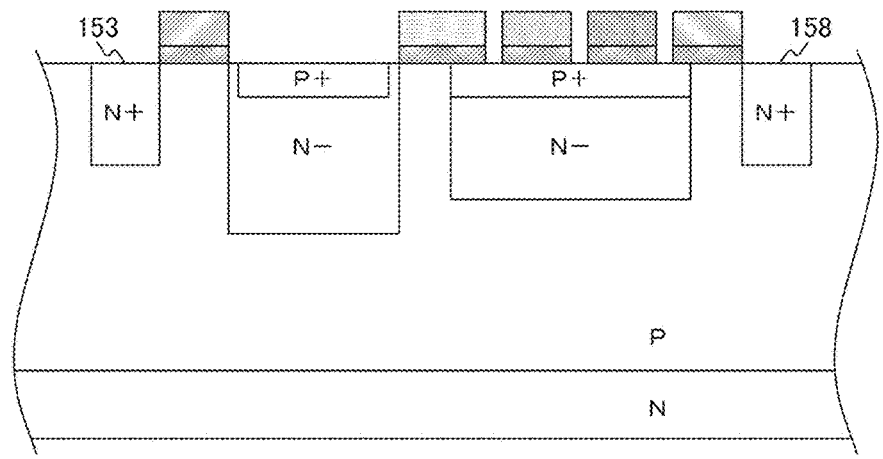

FIGS. 14D and 14E are diagrams illustrating an example of a manufacturing process of the pixel 110 according to the first embodiment of the present technology. The P-type semiconductor region 155 is formed in the substrate on which the gate 141 and the like are formed (FIG. 14D), and the N-type semiconductor regions 153 and 158 are formed in the substrate (FIG. 14E). They can be formed using the ion implantation.

In this manner, in the first embodiment of the present technology, the negative bias voltage is applied to the generated-charge retention portion 156, and at the end of the period of transferring the charge retained in the generated-charge retention portion 156, the voltage intermediate between the control voltage and the bias voltage is applied to the generated-charge retention portion 156. This makes it possible to transfer all the charges retained in the generated-charge retention portion 156 to the output charge retention portion 111 while reducing or eliminating the influence of the dark current caused by the surface level of the semiconductor substrate.

[Modification]

In the embodiment described above, the intermediate voltage is applied to the transfer signal line TRX1 or the like, but the intermediate voltage may be applied in a pseudo manner by smoothly changing the applied voltage from the control voltage to the bias voltage. This makes it possible to simplify the configuration of the imaging apparatus 10.

Figure 15:
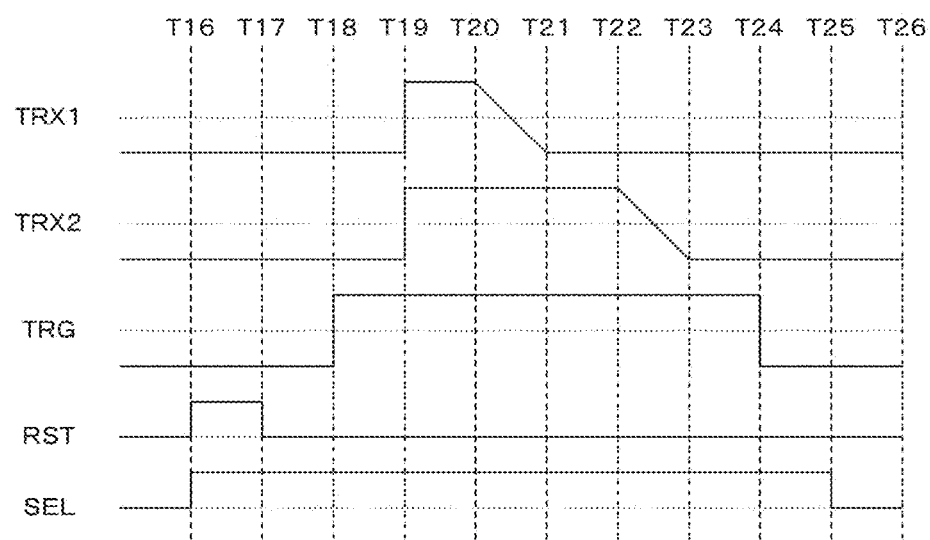
FIG. 15 is a diagram illustrating an example of signal generation processing according to a modification of the first embodiment of the present technology.

FIG. 15 is a diagram illustrating an example of signal generation processing in a modification of the first embodiment of the present technology. This figure illustrates the processing of the period of the transfer of the retained-charge after the exposure (period T16 to T26) in the signal generation processing described with reference to FIG. 4. During the period T20 to T21, the voltage applied to the transfer signal line TRX1 is changed smoothly from the control voltage to the bias voltage. Similarly, during the period T22 to T23, the voltage applied to the transfer signal line TRX2 is changed smoothly from the control voltage to the bias voltage. This allows a voltage close to the intermediate voltage to be applied to the first generated-charge retention gate 143 or the like for a relatively long time. Moreover, when the voltage to be applied is switched from the control voltage to the bias voltage, the smoothing of the waveform by an integrating circuit or the like makes it possible to generate a smoothly changing voltage waveform as described above. The signal generation processing other than that described above is similar to the processing described with reference to FIG. 4, so a description thereof will be omitted. The application of the intermediate voltage can be omitted, so it is possible to simplify the configuration of the imaging apparatus 10.

The configuration of the imaging apparatus 10 other than that described above is similar to the configuration of the imaging apparatus 10 according to the first embodiment of the present technology, so a description thereof will be omitted.

In this manner, in the modification of the first embodiment of the present technology, the voltage to be applied is smoothly changed from the control voltage to the bias voltage, instead of applying the intermediate voltage to the generated-charge retention gate 143 or the like. This makes it possible to simplify the configuration of the imaging apparatus 10.

2. Second Embodiment

In the first embodiment described above, in the retained-charge transfer after the exposure, the retained-charge transfer portion 126 is made conductive, and then the control voltage is applied to the first generated-charge retention gate 143 and the second generated-charge retention gate 144. On the other hand, in a second embodiment of the present technology, the retained-charge transfer portion 126 is made conductive at the same time as or after the application of the control voltage to the first generated-charge retention gate 143 or the like. This makes it possible to prevent the reverse flow of charges from the output charge retention portion 111 to the generated-charge retention portion 156, thereby reducing the error of the image signal.

[Signal Generation Processing]

Figure 16A:
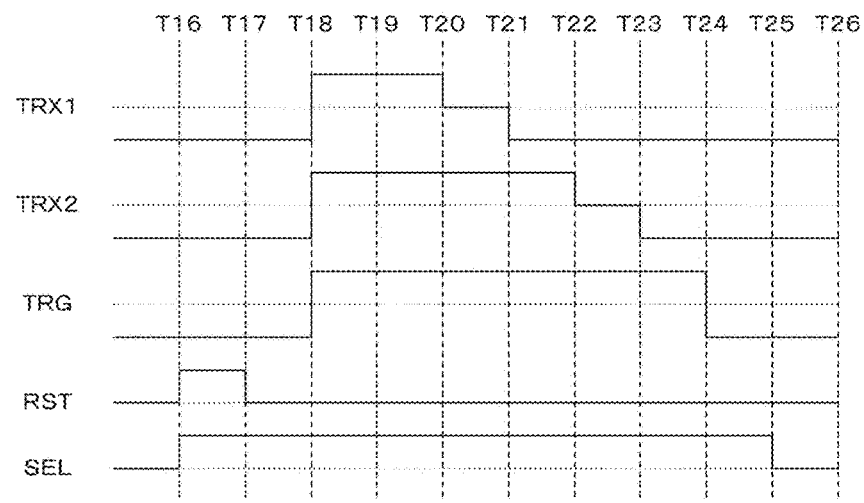
FIGS. 16A and 16B are diagrams illustrating an example of signal generation processing according to a second embodiment of the present technology.
Figure 16B:
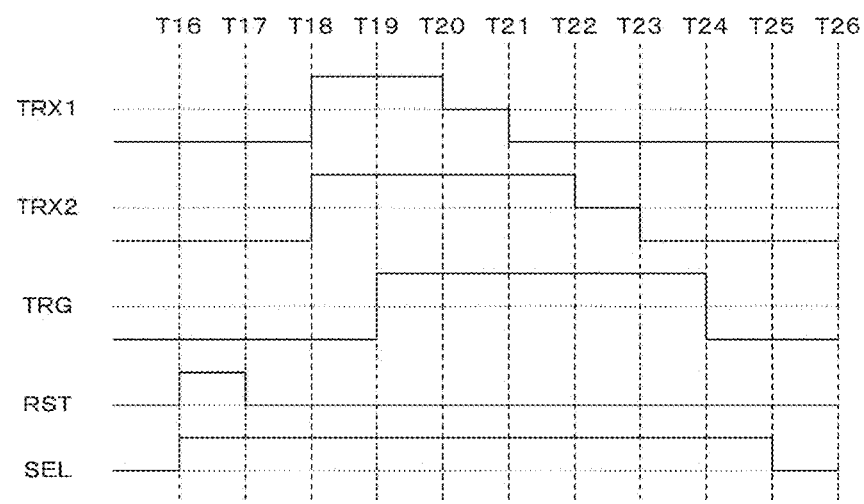

FIGS. 16A and 16B are diagrams illustrating an example of signal generation processing according to the second embodiment of the present technology. FIGS. 16A and 16B illustrate the processing of the period of the retained-charge transfer after the exposure (period T16 to T26) in the signal generation processing described with reference to FIG. 4. FIG. 16A is an example in the case where the control voltage is applied to the transfer signal lines TRX1 and TRX 2, and the on voltage is applied to the transfer signal line TRG during the period T18 to T19. In this case, the control voltage is applied to the first generated-charge retention gate 143 and the second generated-charge retention gate 144, the potential is deepened, and at the same time, the retained-charge transfer portion 126 is made conductive.

Further, during the period T18 to T20, FIG. 16B illustrates an example in a case where the control voltage is first applied to the transfer signal lines TRX1 and TRX2 (period T18 to T19) and then the on voltage is applied to the transfer signal line TRG (period T19 To T20). In this case, after the potential of the generated-charge retention portion 156 is deepened, and the retained-charge transfer portion 126 is made conductive. When the potential of the generated-charge retention portion 156 is deepened, the potential of the retained-charge transfer portion 126 that is capacitance-coupled thereto also is deepened, so it is possible to prevent the reverse flow of charges from the output charge retention portion 111 to the generated-charge retention portion 156. The signal generation processing other than that described above is similar to the processing described with reference to FIG. 4, so a description thereof will be omitted.

The configuration of the imaging apparatus 10 other than that described above is similar to the configuration of the imaging apparatus 10 according to the first embodiment of the present technology, so a description thereof will be omitted.

As described above, in the second embodiment of the present technology, at the time of the retained-charge transfer, the control voltage is applied to the first generated-charge retention gate 143 and the second generated-charge retention gate 144 and then the retained-charge transfer portion 126 is made conductive. This makes it possible to prevent the reverse flow of charges from the output charge retention portion 111 to the generated-charge retention portion 156, thereby reducing the error of the image signal.

3. Third Embodiment

In the first embodiment described above, the intermediate voltage is applied to the first generated-charge retention gate 143 and the second generated-charge retention gate 144. On the other hand, in a third embodiment of the present technology, the intermediate voltage is further applied to the gate of the retained-charge transfer portion 126. This makes it possible to achieve the complete charge transfer.

[Signal Generation Processing]

Figure 17:
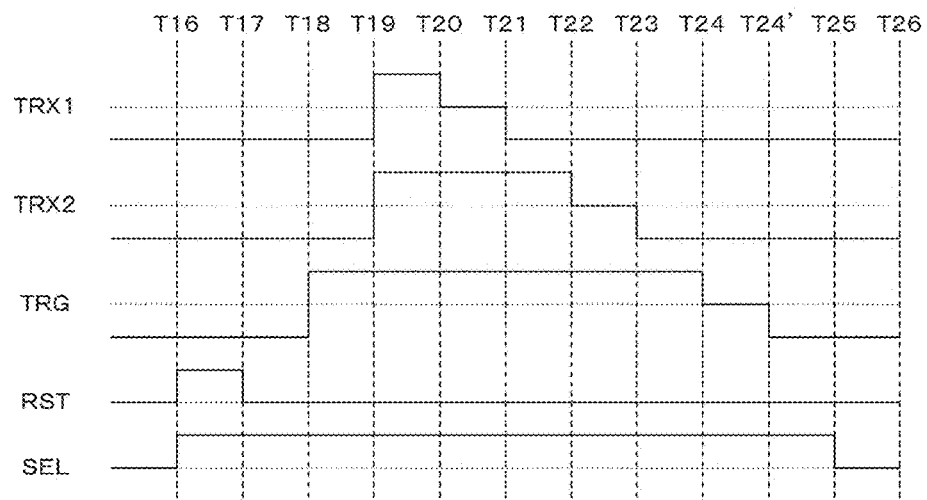
FIG. 17 is a diagram illustrating an example of signal generation processing according to a third embodiment of the present technology.

FIG. 17 is a diagram illustrating an example of signal generation processing according to the third embodiment of the present technology. This figure illustrates the processing of the period of the retained-charge transfer after the exposure (period T16 to T26) in the signal generation processing described with reference to FIG. 4. In the process of this figure, during the period T24 to T24', an approximately intermediate voltage between on voltage and off voltage is applied to the transfer signal line TRG. A voltage of approximately 0 V can be applied as the approximately intermediate voltage. This allows the potential gradient of the channel region of the retained-charge transfer portion 126 to be increased and the charges accumulated in the channel region of the retained-charge transfer portion 126 to be transferred to the output charge retention portion 111.

The configuration of the imaging apparatus 10 other than that described above is similar to the configuration of the imaging apparatus 10 according to the first embodiment of the present technology, so a description thereof will be omitted.

As described above, according to the third embodiment of the present technology, the application of the intermediate voltage to the retained-charge transfer portion 126 in the retained-charges transfer after the exposure makes it possible to achieve the complete transfer of charges remaining in the channel region of the retained-charge transfer portion 126.

4. Fourth Embodiment

In the first embodiment described above, the potential of the generated-charge retention portion 156 is controlled using the two generated-charge retention gates. On the other hand, a fourth embodiment of the present technology performs the control using three generated-charge retention gates. This makes it possible to reduce the charges remaining in the generated-charge retention portion 156 during the charge transfer.

[Arrangement of Pixels]

Figure 18:
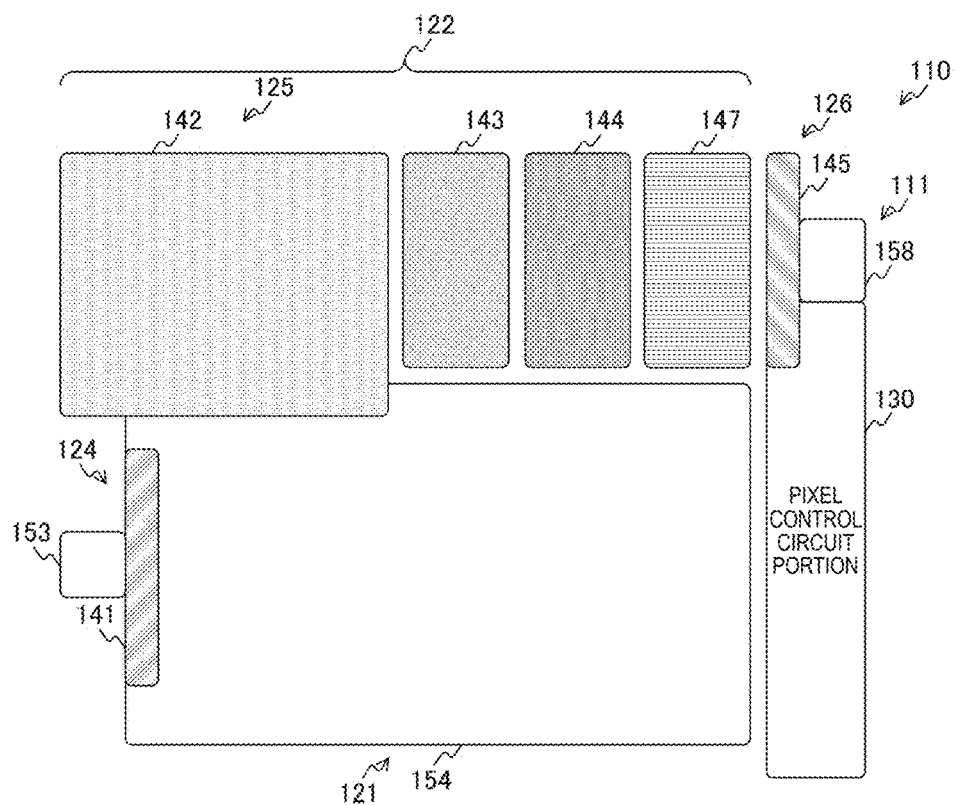
FIG. 18 is a plan view illustrating an exemplary configuration of a pixel 110 according to a fourth embodiment of the present technology.

FIG. 18 is a plan view illustrating an exemplary configuration of the pixel 110 according to the fourth embodiment of the present technology. This figure illustrates schematically the arrangement of the pixel 110 in the surface of the semiconductor substrate, which is similar to FIG. 12. This is different from the pixel 110 described with reference to FIG. 12 in that a third generated-charge retention gate 147 is further arranged to be adjacent to the second generated-charge retention gate 144. Also in the case shown in this figure, at the end of the retained-charge transfer, the voltage applied sequentially from the first generated-charge retention gate 143 arranged at a position far from the retained-charge transfer portion 126 is changed from the control voltage to the bias voltage. In the arrangement of the pixels 110, in a case where the distance from the photoelectric converter 121 to the output charge retention portion 111 is relatively large, the charge transfer distance in the generated-charge retention portion 156 becomes relatively large. Thus, the generated-charge retention gate of the generated-charge retention portion 156 is set to be divided into three gates, that is, the first generated-charge retention gate 143, the second generated-charge retention gate 144, and the third generated-charge retention gate 147, and then the transfer is performed. This makes it possible to reduce the charges remaining in the generated-charge retention portion 156.

Moreover, the configuration of the generated-charge retention portion 156 is not limited to this example. In one example, it is possible to have a configuration in which four or more generated-charge retention gates are provided and these generated-charge retention gates perform the charge transfer.

The configuration of the imaging apparatus 10 other than that described above is similar to the configuration of the imaging apparatus 10 according to the first embodiment of the present technology, so a description thereof will be omitted.

As described above, according to the fourth embodiment of the present technology, it is possible to reduce the charges remaining in the generated-charge retention portion 156 in the case where the charge transfer distance in the generated-charge retention portion 156 is large.

5. Fifth Embodiment

In the first embodiment described above, the potential of the generated-charge retention portion 156 is controlled using the two generated-charge retention gates. On the other hand, in a fifth embodiment of the present technology, the control is performed using one generated-charge retention gate. This makes it possible to simplify the configuration of the imaging apparatus 10.

[Arrangement of Pixels]

Figure 19:
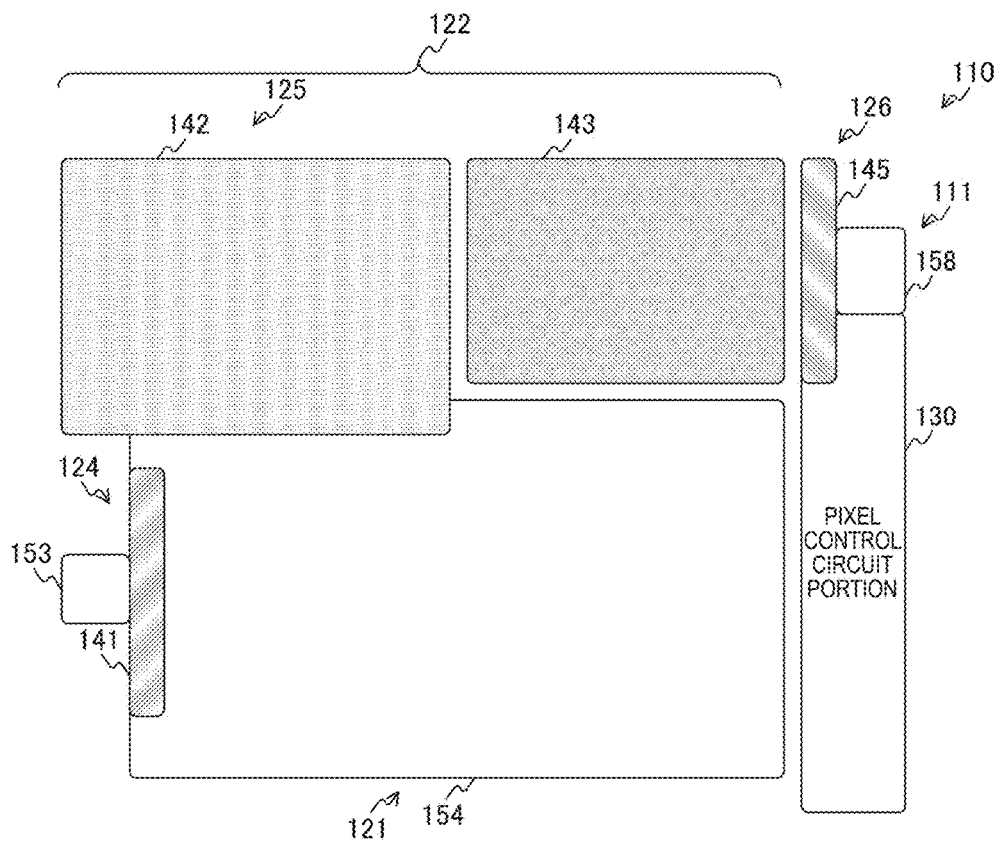
FIG. 19 is a plan view illustrating an exemplary configuration of a pixel 110 according to a fifth embodiment of the present technology.

FIG. 19 is a plan view illustrating an exemplary configuration of the pixel 110 according to the fifth embodiment of the present technology. This figure illustrates schematically the arrangement of the pixels 110 in the surface of the semiconductor substrate, which is similar to FIG. 12. The pixel 110 in this figure is not necessary to have the second generated-charge retention gate 144. In the arrangement of the pixels 110, in a case where the distance from the photoelectric converter 121 to the output charge retention portion 111 is relatively small, the charge transfer can be performed using one generated-charge retention gate (the first generated-charge retention gate 143). In other words, in the case where the charge transfer distance in the generated-charge retention portion 156 is relatively small, the second generated-charge retention gate 144 can be omitted.

The configuration of the imaging apparatus 10 other than that described above is similar to the configuration of the imaging apparatus 10 according to the first embodiment of the present technology, so a description thereof will be omitted.

As described above, according to the fifth embodiment of the present technology, in the case where the charge transfer distance in the generated-charge retention portion 156 is small, it is possible to reduce the number of generated-charge retention gates, thereby simplifying the configuration of the imaging apparatus 10.

6. Sixth Embodiment

In the first embodiment described above, the pixel 110 includes one photo-charge generation portion 120. On the other hand, in a sixth embodiment of the present technology, two photo-charge generation portions are provided and they shares one output charge retention portion 111. This makes it possible to simplify the configuration of the imaging apparatus 10.

[Circuit Configuration of Pixel]

Figure 20:
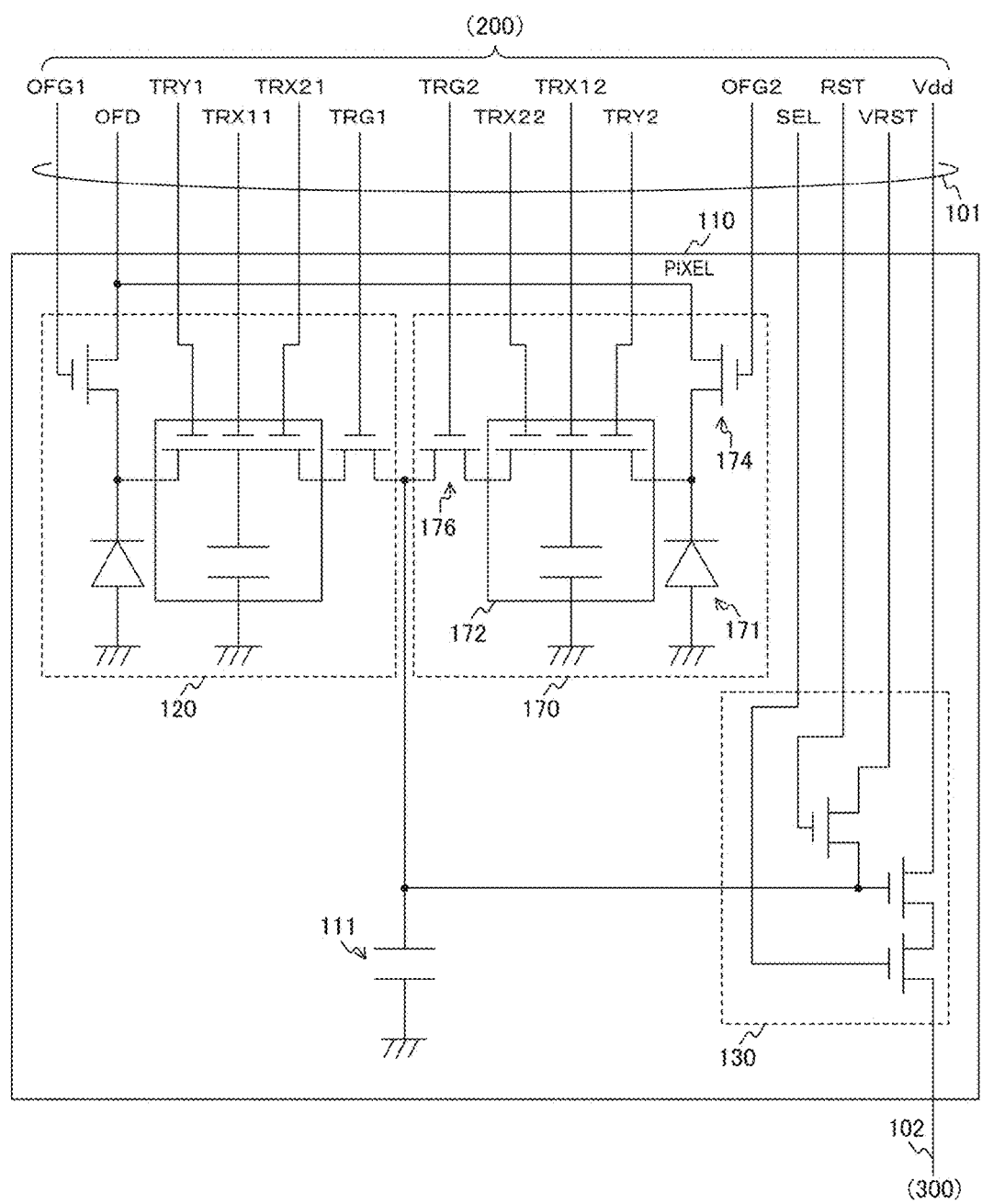
FIG. 20 is a diagram illustrating an exemplary configuration of a pixel 110 according to a sixth embodiment of the present technology.

FIG. 20 is a diagram illustrating an exemplary configuration of the pixel 110 according to the sixth embodiment of the present technology. The pixel 110 in this figure is different from the pixel 110 described with reference to FIG. 2 in that it further includes a photo-charge generation portion 170. As illustrated in this figure, the outputs of the photo-charge generation portions 120 and 170 are connected in common to the output charge retention portion 111 and the pixel control circuit portion 130.

The photo-charge generation portion 170 includes a photoelectric converter 171, an overflow gate 174, a charge retention portion 172, and a retained-charge transfer portion 176. The connection between them is similar to that of the photo-charge generation portion 120, so a description thereof will be omitted.

[Arrangement of Pixels]

Figure 21:
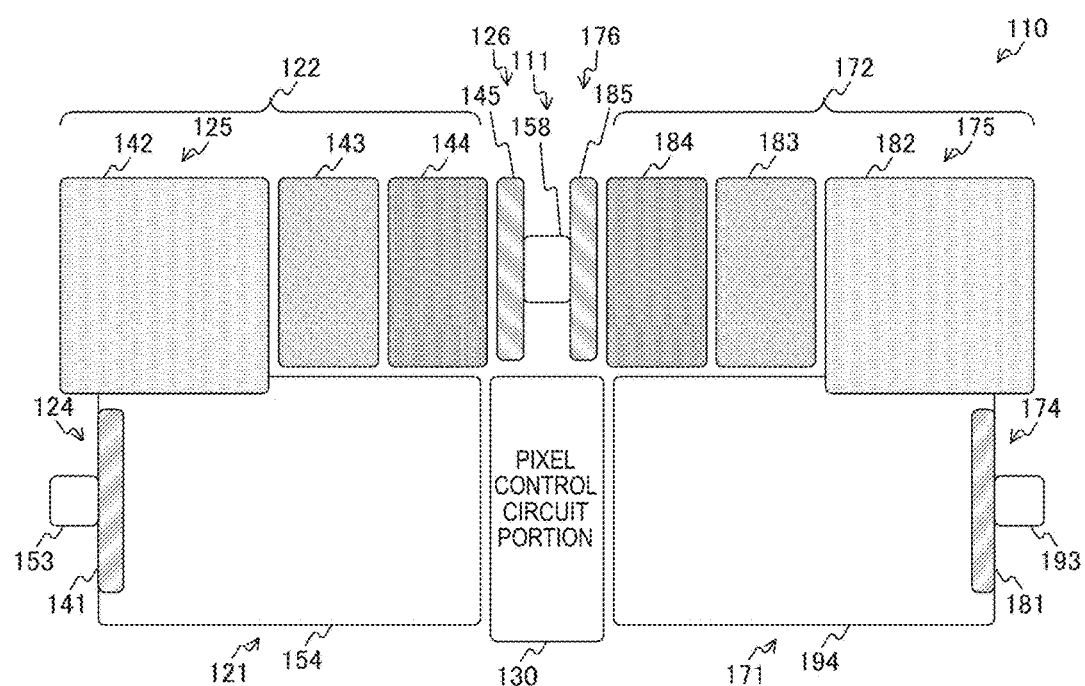
FIG. 21 is a plan view illustrating an exemplary configuration of the pixel 110 according to the sixth embodiment of the present technology.

FIG. 21 is a plan view illustrating an exemplary configuration of the pixel 110 according to the sixth embodiment of the present technology. This figure illustrates schematically the arrangement of the pixels 110 in the surface of the semiconductor substrate, which is similar to FIG. 12. Moreover, the charge retention portion 172 includes a generated-charge transfer portion 175, a first generated-charge retention gate 183, a second generated-charge retention gate 184, and a generated-charge retention portion (not shown). In addition, the generated-charge transfer portion 175 includes a gate 182, and the retained-charge transfer portion 176 includes a retained-charge transfer gate 185. In this figure, an N-type semiconductor region 194 of the photoelectric converter 171 is arranged on the right side of the pixel control circuit portion 130. A gate 181 and an N-type semiconductor region 193 of the overflow gate 174 are arranged sequentially to be adjacent on the right side of the photoelectric converter 171. The gate 182 of the generated-charge transfer portion 175 is arranged on the upper right of the photoelectric converter 171. The first generated-charge retention gate 183 and the second generated-charge retention gate 184 are arranged sequentially to be adjacent to the left side of the generated-charge transfer portion 175. The retained-charge transfer gate 185 of the retained-charge transfer portion 176 is arranged between the second generated-charge retention gate 184 and the output charge retention portion 111. In this manner, the photo-charge generation portions 120 and 170 are arranged symmetrically on both sides of the output charge retention portion 111 and the pixel control circuit portion 130.

Figure 22:
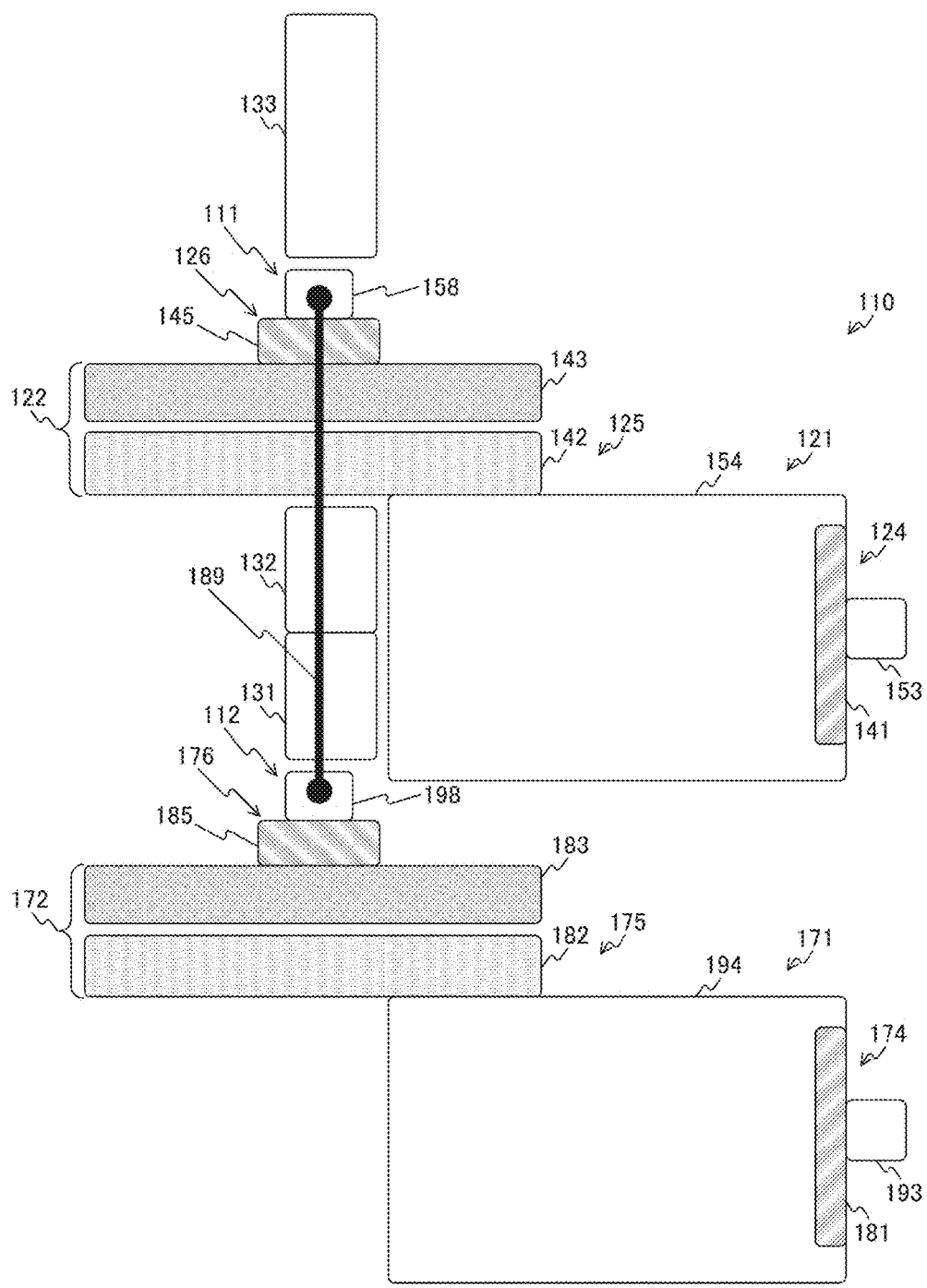
FIG. 22 is a plan view illustrating another exemplary configuration of the pixel 110 according to the sixth embodiment of the present technology.
Figure 23A:
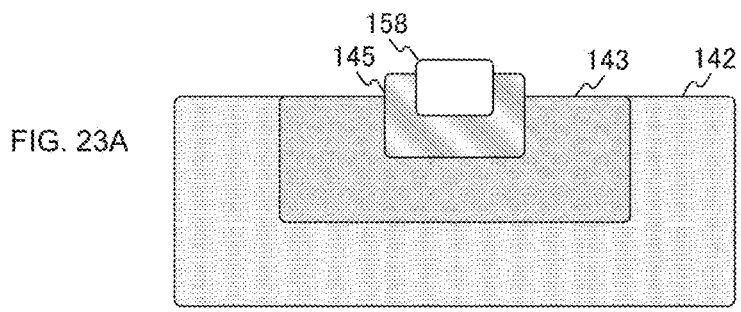
FIGS. 23A, 23B, 23C, and 23D are plan views illustrating an exemplary configuration of a pixel 110 according to a modification of the embodiment of the present technology.
Figure 23B:
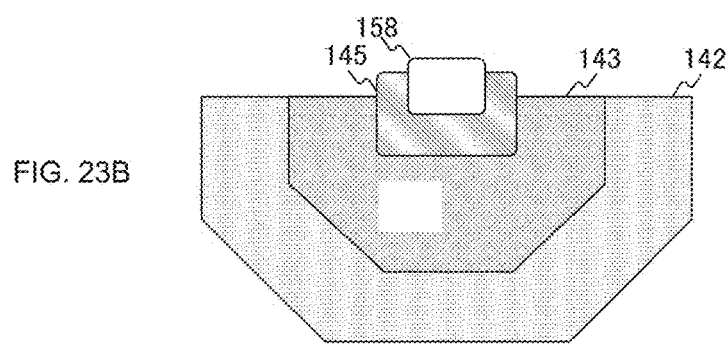
Figure 23C:
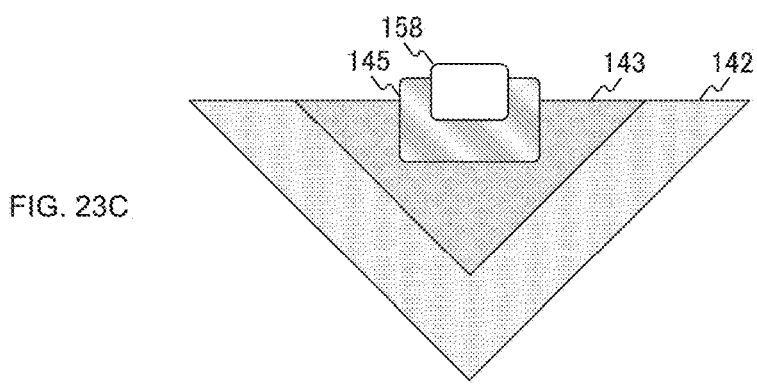
Figure 23D:
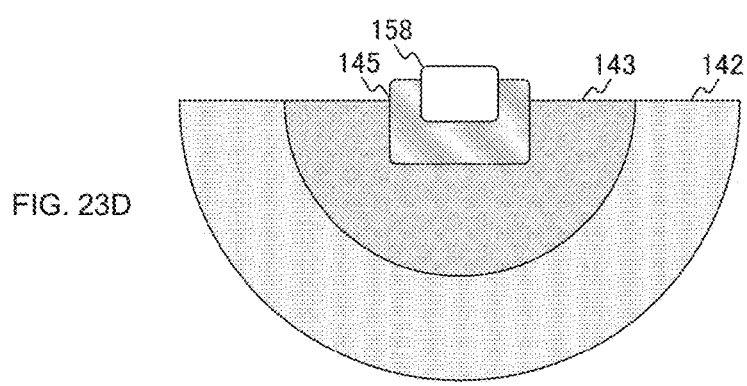

FIG. 22 is a plan view illustrating another exemplary configuration of the pixel 110 according to the sixth embodiment of the present technology. Each of the charge retention portions 122 and 172 in this figure employs a generated-charge retention portion in which one generated-charge retention gate (the first generated-charge retention gate 143 and 183, respectively) described with reference to FIG. 19 is arranged. In addition, the photo-charge generation portion 170 in this figure includes an N-type semiconductor region 198 having a configuration similar to that of the N-type semiconductor region 158 of the output charge retention portion 111. They are electrically connected via a wiring 189. The arrangement of the photo-charge generation portion 120 is first described. The photoelectric converter 121 is arranged in the central part of this figure, and the overflow gate 124 is arranged on the right side thereof. The generated-charge transfer portion 125 and the first generated-charge retention gate 143 are arranged sequentially at the upper left part of the photoelectric converter 121. The retained-charge transfer portion 126 is arranged to be adjacent to the first generated-charge retention gate 143, and the output charge retention portion 111 is arranged to be adjacent to the retained-charge transfer portion 126. The photo-charge generation portion 170 has an arrangement similar to that of the photo-charge generation portion 120. The MOS transistor 133 in the pixel control circuit portion 130 is arranged above the N-type semiconductor region 158 of the output charge retention portion 111, and the charge discharger 131 and the MOS transistor 132 are arranged on the left side of the photoelectric converter 121.

The configuration of the imaging apparatus 10 other than that described above is similar to the configuration of the imaging apparatus 10 according to the first embodiment of the present technology, so a description thereof will be omitted.

As described above, according to the sixth embodiment of the present technology, the pixel control circuit portion 130 and the like are shared by the photo charge generation portions 120 and 170 in the pixel 110, so it is possible to simplify the configuration of the imaging apparatus 10.

7. Modification

In the embodiment described above, the generated-charge transfer portion 125, the generated-charge retention portion 156, and the retained-charge transfer portion 126 have a rectangular shape. On the other hand, in the modification of the present technology, the shape of them is changed to shorten the charge transfer path generated by the photoelectric converter 121.

[Arrangement of Pixels]

FIGS. 23A, 23B, 23C, and 23D are plan views illustrating an exemplary configuration of the pixel 110 according to a modification of the embodiment of the present technology. This figure illustrates the configuration of the generated-charge transfer portion 125, the generated-charge retention portion 156, the retained-charge transfer portion 126, and the output charge retention portion 111 in the pixel 110. In the pixel 110 of FIG. 23A, the retained-charge transfer gate 145 of the retained-charge transfer portion 126 is arranged to be adjacent to a region directly under the N-type semiconductor region 158 of the output charge retention portion 111. The first generated-charge retention gate 143 is arranged in a region below the retained-charge transfer portion 126. Furthermore, the gate 142 of the generated-charge transfer portion 125 is arranged outside the first generated-charge retention gate 143. Moreover, the shape of the generated-charge transfer portion 125 and the generated-charge retention portion 156 may have shapes shown in FIGS. 23B, 23C, and 23D.

As described above, according to the modification of the embodiment of the present technology, the arrangement of the retained-charge transfer portion 126 and the output charge retention portion 111 in the central part of the generated-charge retention portion 156 makes it possible to shorten the charge transfer path.

As described above, in the embodiments of the present technology, in the imaging apparatus 10 having the global shutter function, a negative bias voltage is applied to the generated-charge retention portion 156. Furthermore, at the end of the period for transferring the charge retained in the generated-charge retention portion 156, a voltage intermediate between the control voltage and the bias voltage is applied to the generated-charge retention portion 156. This makes it possible to transfer all the charges retained in the generated-charge retention portion 156 to the output charge retention portion 111 while reducing or eliminating the influence of the dark current caused by the surface level.

The embodiments described above are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a hard disk, a compact disc (CD), MiniDisc (MD), and a digital versatile disk (DVD), a memory card, and a Blu-ray disc (registered trademark) can be used.

Note that the effects described in the present specification are not limiting but are merely examples, and there may be other effects.

Additionally, the present technology may also be configured as below.

(1)

A solid-state image sensor including:

a photoelectric converter configured to generate a charge corresponding to an exposure amount during a predetermined exposure period;

a generated-charge retention portion formed in a semiconductor region and configured to retain the charge;

a generated-charge transfer portion configured to transfer the charge from the photoelectric converter to the generated-charge retention portion to perform generated-charge transfer by allowing electrical conduction between the photoelectric converter and the generated-charge retention portion after an elapse of the exposure period;

an output charge retention portion configured to retain the charge;

a retained-charge transfer portion configured to transfer the charge retained in the generated-charge retention portion to the output charge retention portion to perform retained-charge transfer by allowing electrical conduction between the generated-charge retention portion and the output charge retention portion;

a signal generation portion configured to generate a signal corresponding to the charge retained in the output charge retention portion as an image signal after the retained-charge transfer; and a generated-charge retention gate portion configured to apply a control voltage for controlling potential of the generated-charge retention portion to the generated-charge retention portion during a period of the generated-charge transfer and the retained-charge transfer, apply a bias voltage having a polarity different from the control voltage to the generated-charge retention portion during a period different from the period of the generated-charge transfer and the retained-charge transfer, and apply the bias voltage to the generated-charge retention portion after applying an approximately intermediate voltage between the control voltage and the bias voltage to the generated-charge retention portion at an end of the period of the retained-charge transfer.

(2)

The solid-state image sensor according to (1), in which the generated-charge retention gate portion applies a voltage of approximately 0 V to the generated-charge retention portion as the approximately intermediate voltage between the control voltage and the bias voltage.

(3)

The solid-state image sensor according to (1) or (2), in which the generated-charge retention gate portion includes a plurality of electrodes and, when a change in voltages to be applied at an end of the retained-charge transfer from the control voltage to the bias voltage is performed, performs the change sequentially starting from an electrode arranged at a position far from the retained-charge transfer portion among the plurality of electrodes.

(4)

The solid-state image sensor according to any one of (1) to (3), further including:

a semiconductor region arranged between the generated-charge retention portion and the generated-charge retention gate and formed to have a conductivity type different from a conductivity type of the semiconductor region in which the generated-charge retention portion is formed.

(5)

The solid-state image sensor according to any one of (1) to (4), further including:

a charge discharger configured to discharge the charge retained in the output charge retention portion before the retained-charge transfer.

(6)

The solid-state image sensor according to (5), in which the charge discharger is made nonconductive during the period of the retained-charge transfer for discharging the charge remaining in the generated-charge retention portion before the generated-charge transfer.

(7)

The solid-state image sensor according to any one of (1) to (6), in which the generated-charge retention gate portion is applied with the control voltage before making the retained-charge transfer portion conductive in the retained-charge transfer.

(8)

The solid-state image sensor according to any one of (1) to (7), in which the retained-charge transfer portion further includes a retained-charge transfer gate in which application of an on voltage used to make the retained-charge transfer portion conductive and application of an off voltage having a polarity different from a polarity of the on voltage are performed.

(9)

The solid-state image sensor according to (8), in which, in the retained-charge transfer portion, the off voltage is applied to the retained-charge transfer gate after an approximately intermediate voltage between the on voltage and the off voltage is applied to the retained-charge transfer gate at the end of the period of the retained-charge transfer.

(10)

The solid-state image sensor according to (9), in which, in the retained-charge transfer portion, a voltage of approximately 0 V is applied to the retained-charge transfer gate as the approximately intermediate voltage between the on-voltage and the off-voltage.

(11)

An imaging apparatus including:

a photoelectric converter configured to generate a charge corresponding to an exposure amount during a predetermined exposure period;

a generated-charge retention portion formed in a semiconductor region and configured to retain the charge;

a generated-charge transfer portion configured to transfer the charge from the photoelectric converter to the generated-charge retention portion to perform generated-charge transfer by allowing electrical conduction between the photoelectric converter and the generated-charge retention portion after an elapse of the exposure period;

an output charge retention portion configured to retain the charge;

a retained-charge transfer portion configured to transfer the charge retained in the generated-charge retention portion to the output charge retention portion to perform retained-charge transfer by allowing electrical conduction between the generated-charge retention portion and the output charge retention portion;

a signal generation portion configured to generate a signal corresponding to the charge retained in the output charge retention portion as an image signal after the retained-charge transfer;

a generated-charge retention gate portion configured to apply a control voltage for controlling potential of the generated-charge retention portion to the generated-charge retention portion during a period of the generated-charge transfer and the retained-charge transfer, apply a bias voltage having a polarity different from the control voltage to the generated-charge retention portion during a period different from the period of the generated-charge transfer and the retained-charge transfer, and apply the bias voltage to the generated-charge retention portion after applying an approximately intermediate voltage between the control voltage and the bias voltage to the generated-charge retention portion at an end of the period of the retained-charge transfer; and a processing circuit configured to process the generated signal.

REFERENCE SIGNS LIST 10 imaging apparatus
100 pixel array portion
110 pixel
111 output charge retention portion
120, 170 photo-charge generation portion
121, 171 photoelectric converter
122, 172 charge retention portion
124, 174 overflow gate
125, 175 generated-charge transfer portion
126, 176 retained-charge transfer portion
130 pixel control circuit portion
131 charge discharger
132, 133 MOS transistor
134 signal generation portion
143, 183 first generated-charge retention gate
144, 184 second generated-charge retention gate
145, 185 retained-charge transfer gate
147 third generated-charge retention gate 153, 154, 158, 159, 193, 194, 198 N-type semiconductor region
156 generated-charge retention portion
155, 157 P-type semiconductor region
200 vertical driver
300 column signal processor
400 controller

The invention claimed is:

1. A solid-state image sensor comprising:
a photoelectric converter configured to generate a charge corresponding to an exposure amount during a predetermined exposure period;
a generated-charge retention portion formed in a semiconductor region and configured to retain the charge;
a generated-charge transfer portion configured to transfer the charge from the photoelectric converter to the generated-charge retention portion to perform generated-charge transfer by allowing electrical conduction between the photoelectric converter and the generated-charge retention portion after an elapse of the exposure period;
an output charge retention portion configured to retain the charge;
a retained-charge transfer portion configured to transfer the charge retained in the generated-charge retention portion to the output charge retention portion to perform retained-charge transfer by allowing electrical conduction between the generated-charge retention portion and the output charge retention portion;
a signal generation portion configured to generate a signal corresponding to the charge retained in the output charge retention portion as an image signal after the retained-charge transfer; and
a generated-charge retention gate portion configured to apply a control voltage for controlling potential of the generated-charge retention portion to the generated-charge retention portion during a period of the generated-charge transfer and the retained-charge transfer, apply a bias voltage having a polarity different from the control voltage to the generated-charge retention portion during a period different from the period of the generated-charge transfer and the retained-charge transfer, and apply the bias voltage to the generated-charge retention portion after applying an approximately intermediate voltage between the control voltage and the bias voltage to the generated-charge retention portion at an end of the period of the retained-charge transfer.

2. The solid-state image sensor according to claim 1, wherein the generated-charge retention gate portion applies a voltage of approximately 0 V to the generated-charge retention portion as the approximately intermediate voltage between the control voltage and the bias voltage.

3. The solid-state image sensor according to claim 1, wherein the generated-charge retention gate portion includes a plurality of electrodes and, when a change in voltages to be applied at an end of the retained-charge transfer from the control voltage to the bias voltage is performed, performs the change sequentially starting from an electrode arranged at a position far from the retained-charge transfer portion among the plurality of electrodes.

4. The solid-state image sensor according to claim 1, further comprising:
a semiconductor region arranged between the generated-charge retention portion and the generated-charge retention gate and formed to have a conductivity type different from a conductivity type of the semiconductor region in which the generated-charge retention portion is formed.

5. The solid-state image sensor according to claim 1, further comprising:
a charge discharger configured to discharge the charge retained in the output charge retention portion before the retained-charge transfer.

6. The solid-state image sensor according to claim 5, wherein the charge discharger is made nonconductive during the period of the retained-charge transfer for discharging the charge remaining in the generated-charge retention portion before the generated-charge transfer.

7. The solid-state image sensor according to claim 1, wherein the generated-charge retention gate portion is applied with the control voltage before making the retained-charge transfer portion conductive in the retained-charge transfer.

8. The solid-state image sensor according to claim 1, wherein the retained-charge transfer portion further includes a retained-charge transfer gate in which application of an on-voltage used to make the retained-charge transfer portion conductive and application of an off-voltage having a polarity different from a polarity of the on-voltage are performed.

9. The solid-state image sensor according to claim 8, wherein, in the retained-charge transfer portion, the off-voltage is applied to the retained-charge transfer gate after an approximately intermediate voltage between the on-voltage and the off-voltage is applied to the retained-charge transfer gate at the end of the period of the retained-charge transfer.

10. The solid-state image sensor according to claim 9, wherein, in the retained-charge transfer portion, a voltage of approximately 0 V is applied to the retained-charge transfer gate as the approximately intermediate voltage between the on-voltage and the off-voltage.

11. An imaging apparatus comprising:
a photoelectric converter configured to generate a charge corresponding to an exposure amount during a predetermined exposure period;
a generated-charge retention portion formed in a semiconductor region and configured to retain the charge;
a generated-charge transfer portion configured to transfer the charge from the photoelectric converter to the generated-charge retention portion to perform generated-charge transfer by allowing electrical conduction between the photoelectric converter and the generated-charge retention portion after an elapse of the exposure period;
an output charge retention portion configured to retain the charge;
a retained-charge transfer portion configured to transfer the charge retained in the generated-charge retention portion to the output charge retention portion to perform retained-charge transfer by allowing electrical conduction between the generated-charge retention portion and the output charge retention portion;
a signal generation portion configured to generate a signal corresponding to the charge retained in the output charge retention portion as an image signal after the retained-charge transfer;
a generated-charge retention gate portion configured to apply a control voltage for controlling potential of the generated-charge retention portion to the generated-charge retention portion during a period of the generated-charge transfer and the retained-charge transfer, apply a bias voltage having a polarity different from the control voltage to the generated-charge retention portion during a period different from the period of the generated-charge transfer and the retained-charge transfer, and apply the bias voltage to the generated-charge retention portion after applying an approximately intermediate voltage between the control voltage and the bias voltage to the generated-charge retention portion at an end of the period of the retained-charge transfer; and a processing circuit configured to process the generated signal.

\* \* \* \* \*